US012075141B2

(12) United States Patent
Vitale et al.

(10) Patent No.: US 12,075,141 B2
(45) Date of Patent: Aug. 27, 2024

(54) HEATSINKS AND THERMAL ARCHITECTURE OF AN IMAGE CAPTURE DEVICE

(71) Applicant: GoPro, Inc., San Mateo, CA (US)

(72) Inventors: Nicholas Vitale, Foster City, CA (US); Raul Vargas Gonzalez, Redwood City, CA (US)

(73) Assignee: GoPro, Inc., San Mateo, CA (US)

( * ) Notice: Subject to any disclaimer, the term of this patent is extended or adjusted under 35 U.S.C. 154(b) by 97 days.

(21) Appl. No.: 17/901,964

(22) Filed: Sep. 2, 2022

(65) Prior Publication Data

US 2024/0073499 A1 Feb. 29, 2024

Related U.S. Application Data

(63) Continuation-in-part of application No. 17/893,673, filed on Aug. 23, 2022.

(51) Int. Cl.
| | | |
|---|---|---|
| H04N 23/52 | (2023.01) | |
| H04N 23/51 | (2023.01) | |
| H05K 7/20 | (2006.01) | |

(52) U.S. Cl.
CPC ............ *H04N 23/52* (2023.01); *H04N 23/51* (2023.01); *H05K 7/2039* (2013.01)

(58) Field of Classification Search
CPC ....... H04N 23/52; H04N 23/51; H05K 7/2039
USPC ......................................................... 348/164
See application file for complete search history.

(56) References Cited

U.S. PATENT DOCUMENTS

| | | |
|---|---|---|
| 5,471,027 A | 11/1995 | Call |
| 6,097,598 A | 8/2000 | Miyahara |
| 7,329,869 B2 | 2/2008 | Cassel |
| 9,025,080 B2 | 5/2015 | Samuels |
| 9,860,970 B2 | 1/2018 | Tolbert |
| 9,910,342 B2 | 3/2018 | Samuels |
| 10,613,420 B2 | 4/2020 | Ali |
| 10,656,689 B2 | 5/2020 | Kilgore |
| 10,701,249 B1 | 6/2020 | Guo |
| 11,146,711 B1 | 10/2021 | Crow |
| 11,277,545 B2 | 3/2022 | Crow |
| 2003/0128536 A1 | 7/2003 | Radu |

(Continued)

FOREIGN PATENT DOCUMENTS

| | | |
|---|---|---|
| CN | 110235059 | 9/2019 |
| CN | 110235059 A | 9/2019 |

(Continued)

OTHER PUBLICATIONS

International Search Report and Written Opinion for App. No. PCT/US2021/019970, dated Jun. 3, 2021, 9 pages.

(Continued)

*Primary Examiner* — Joel W Fosselman
(74) *Attorney, Agent, or Firm* — Young Basile Hanlon & MacFarlane, P.C.

(57) ABSTRACT

A image capture device including: heat generating devices, one or more batteries, and a sensor heat spreader. The heat generating devices generate a thermal load. The sensor heat spreader is in thermal communication with one or more of the heat generating devices and extends from the one or more of the heat generating devices to the one or more batteries so that all or a portion of the thermal load is transferred to the one or more batteries.

15 Claims, 12 Drawing Sheets

(56) References Cited

U.S. PATENT DOCUMENTS

| | | |
|---|---|---|
| 2003/0202328 A1 | 10/2003 | Deeney |
| 2004/0169771 A1 | 9/2004 | Washington |
| 2006/0100336 A1 | 5/2006 | Fukui |
| 2008/0056695 A1 | 3/2008 | Huang |
| 2008/0205881 A1 | 8/2008 | Sakurai |
| 2009/0274953 A1 | 11/2009 | Myers |
| 2010/0296805 A1 | 11/2010 | Mayer |
| 2011/0127912 A1 | 6/2011 | Lee |
| 2011/0194009 A1 | 8/2011 | Park |
| 2012/0035418 A1 | 2/2012 | Talbert |
| 2014/0055671 A1 | 2/2014 | Kawamura |
| 2014/0104479 A1 | 4/2014 | Samuels |
| 2014/0160284 A1 | 6/2014 | Achenbach |
| 2015/0049243 A1* | 2/2015 | Samuels ............... G03B 17/55 |
| | | 348/374 |
| 2015/0365569 A1 | 12/2015 | Mai |
| 2016/0174408 A1 | 6/2016 | Tolbert |
| 2016/0334692 A1 | 11/2016 | Samuels |
| 2016/0349601 A1 | 12/2016 | Kungl |
| 2016/0374190 A1 | 12/2016 | Tolbert |
| 2017/0070652 A1 | 3/2017 | Müller |
| 2017/0156205 A1 | 6/2017 | Liu |
| 2017/0195531 A1 | 7/2017 | Warren |
| 2017/0195533 A1 | 7/2017 | Seo |
| 2017/0200992 A1* | 7/2017 | Piggott ............... H01M 10/613 |
| 2017/0294694 A1 | 10/2017 | Tso |
| 2018/0107099 A1 | 4/2018 | Yasuda |
| 2018/0259831 A1 | 9/2018 | Chiu |
| 2019/0041600 A1 | 2/2019 | Sakamoto |
| 2019/0056643 A1 | 2/2019 | Chang |
| 2019/0163037 A1 | 5/2019 | Koyama |
| 2019/0346126 A1 | 11/2019 | Wada |
| 2020/0033774 A1 | 1/2020 | Shinji |
| 2020/0064533 A1 | 2/2020 | Miyazaki |
| 2020/0344395 A1 | 10/2020 | Guo |
| 2020/0351419 A1* | 11/2020 | Sharma ............... H04N 23/51 |
| 2020/0413567 A1 | 12/2020 | Chusseau |
| 2021/0033815 A1 | 2/2021 | Lin |
| 2021/0122299 A1 | 4/2021 | Garcia |
| 2021/0274067 A1 | 9/2021 | Crow |
| 2021/0306536 A1 | 9/2021 | Vitale |
| 2021/0321027 A1 | 10/2021 | Crow |
| 2021/0344819 A1 | 11/2021 | Vitale |
| 2022/0021795 A1 | 1/2022 | Crow |
| 2022/0124226 A1 | 4/2022 | Jeong |
| 2022/0159148 A1 | 5/2022 | Crow |
| 2023/0009451 A1 | 1/2023 | Connolly |
| 2024/0073500 A1 | 2/2024 | Vitale |
| 2024/0073506 A1 | 2/2024 | Vitale |

FOREIGN PATENT DOCUMENTS

| | | |
|---|---|---|
| JP | 2004020798 | 1/2004 |
| JP | 2004020798 A | 1/2004 |
| JP | 2006086752 A | 3/2006 |
| JP | 2008015476 A | 1/2008 |
| JP | 5322866 B2 | 10/2013 |
| JP | 2017073634 | 4/2017 |
| JP | 2017073634 A | 4/2017 |

OTHER PUBLICATIONS

International Search Report and Written Opinion for App. No. PCT/US2021/026140, dated Jul. 1, 2021, 10 pages.

U.S. Appl. No. 16/803,139, filed Feb. 27, 2020, Crow et al.

* cited by examiner

HEATSINKS AND THERMAL ARCHITECTURE OF AN IMAGE CAPTURE DEVICE

CROSS-REFERENCE TO RELATED APPLICATIONS

This application is a continuation in part of U.S. application Ser. No. 17/893,673, filed on Aug. 23, 2022, which is incorporated herein in its entirety.

TECHNICAL FIELD

This disclosure relates to heatsinks and related components that work together to form a thermal architecture to balance heat within an image capture device.

BACKGROUND

Photography during physical activity has been improved by use of simple-to-operate, lightweight, compact cameras or imaging devices. Advancements in technology have allowed for more functionality to be added to the cameras. Faster components have been added to the cameras, allowing for clearer images to be taken by the cameras. Additionally, the cameras have been sealed so that the cameras may be splashed, submerged, or otherwise inundated with water. These improvements have caused an increase in thermal loads within the camera.

SUMMARY

Disclosed herein are implementations of a thermal architecture of an image capture device including heatsinks to move heat generated by the image capture device to be move to predetermined locations of the image capture device. The thermal architecture may balance thermal energy, move thermal energy to heatsinks or heat retaining material, move thermal energy away from heat generating devices, or a combination thereof.

The present teachings provide: an image capture device including: heat generating devices, one or more batteries, and a sensor heat spreader. The heat generating devices generate a thermal load. The sensor heat spreader is in thermal communication with one or more of the heat generating devices and extends from the one or more of the heat generating devices to the one or more batteries so that all or a portion of the thermal load is transferred to the one or more batteries.

The present teachings provide: an image capture device including heat generating devices and a rear heatsink. The heat generating devices generate a thermal load. The rear heatsink in thermal contact with one or more of the heat generating devices heat generating devices and in thermal contact with ambient conditions surrounding the image capture device so that some or all of the thermal load is transferred from the one or more of the heat generating devices through the rear heatsink and into the ambient conditions surrounding the image capture device. The rear heatsink forms an entire rear wall of the image capture device.

The present teachings provide: an image capture device including: a front heatsink, a rear heatsink, and heat generating devices. The front heatsink has a front mass. The rear heatsink is located on an opposite side of the image capture device as the front heatsink, the rear heatsink has a rear mass. The heat generating devices are located between the front heatsink and the rear heatsink. The heat generating devices generate a thermal load and the thermal load is transferred to the front heatsink, the rear heatsink, or both. The rear mass is double or more the front mass so that the rear heatsink can receive double the thermal load or more than the front heatsink from the heat generating devices.

Additional teachings are described in further detail below.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

As more components and processing power are added to image capture devices, more heat is added to image capture devices. Improved thermal management in an image capture device becomes important to provide for extended use of the image capture device. A thermal architecture of an image capture device may provide improved management of heat during image capture. The thermal architecture may move heat retained within the image capture device before the heat impacts operation, components become potentially damaged, and/or the image capture device performs a thermal shutdown. The present disclosure relates to a thermal architecture of an image capture device. The thermal architecture includes heatsinks that are free of communication with an integrated sensor-lens assembly (ISLA), create a space between a housing and heat producing components such as a sensor. The thermal architecture includes heat spreaders, thermal interface materials (TIMS), or both. The heat spreaders may be connected to heat generating devices, heatsink, other heat spreaders, or combination thereof by TIMS. The heatsinks may be in communication (e.g., by heat spreaders) and may work in conjunction to remove heat and move heat within the image capture device. The thermal architecture may store thermal energy, dissipate thermal energy, transfer thermal energy, or a combination thereof. The thermal architecture may extend running times, prevent thermal shutdowns, prevent damaging components, or a combination thereof.

Figure 1A:
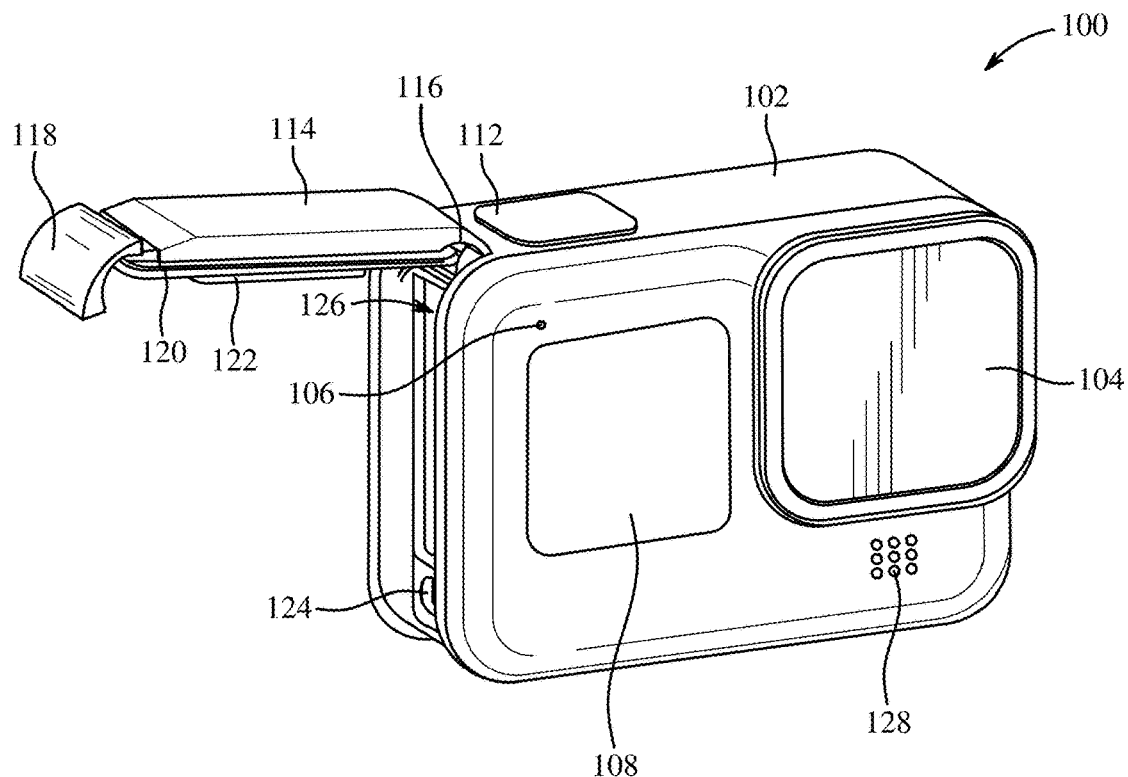
FIGS. 1A-1B are isometric views of an example of an image capture device.
Figure 1B:
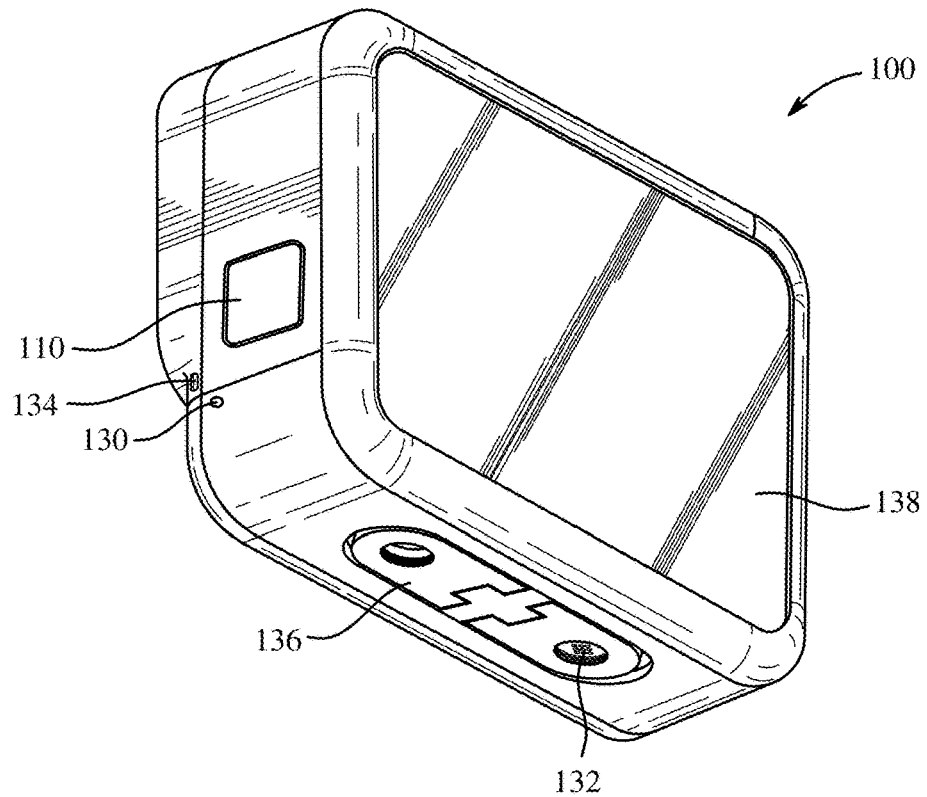

FIGS. 1A-B are isometric views of an example of an image capture device 100. The image capture device 100 may include a body 102, a lens 104 structured on a front surface of the body 102, various indicators on the front surface of the body 102 (such as light-emitting diodes (LEDs), displays, and the like), various input mechanisms (such as buttons, switches, and/or touch-screens), and electronics (such as imaging electronics, power electronics, etc.) internal to the body 102 for capturing images via the lens 104 and/or performing other functions. The lens 104 is configured to receive light incident upon the lens 104 and to direct received light onto an image sensor internal to the body 102. The image capture device 100 may be configured to capture images and video and to store captured images and video for subsequent display or playback.

The image capture device 100 may include an LED or another form of indicator 106 to indicate a status of the image capture device 100 and a liquid-crystal display (LCD) or other form of a display 108 to show status information such as battery life, camera mode, elapsed time, and the like. The image capture device 100 may also include a mode button 110 and a shutter button 112 that are configured to allow a user of the image capture device 100 to interact with the image capture device 100. For example, the mode button 110 and the shutter button 112 may be used to turn the image capture device 100 on and off, scroll through modes and settings, and select modes and change settings. The image capture device 100 may include additional buttons or interfaces (not shown) to support and/or control additional functionality.

The image capture device 100 may include a door 114 coupled to the body 102, for example, using a hinge mechanism 116. The door 114 may be secured to the body 102 using a latch mechanism 118 that releasably engages the body 102 at a position generally opposite the hinge mechanism 116. The door 114 may also include a seal 120 and a battery interface 122. When the door 114 is an open position, access is provided to an input-output (I/O) interface 124 for connecting to or communicating with external devices as described below and to a battery receptacle 126 for placement and replacement of a battery (not shown). The battery receptacle 126 includes operative connections (not shown) for power transfer between the battery and the image capture device 100. When the door 114 is in a closed position, the seal 120 engages a flange (not shown) or other interface to provide an environmental seal, and the battery interface 122 engages the battery to secure the battery in the battery receptacle 126. The door 114 can also have a removed position (not shown) where the entire door 114 is separated from the image capture device 100, that is, where both the hinge mechanism 116 and the latch mechanism 118 are decoupled from the body 102 to allow the door 114 to be removed from the image capture device 100.

The image capture device 100 may include a microphone 128 on a front surface and another microphone 130 on a side surface. The image capture device 100 may include other microphones on other surfaces (not shown). The microphones 128, 130 may be configured to receive and record audio signals in conjunction with recording video or separate from recording of video. The image capture device 100 may include a speaker 132 on a bottom surface of the image capture device 100. The image capture device 100 may include other speakers on other surfaces (not shown). The speaker 132 may be configured to play back recorded audio or emit sounds associated with notifications.

A front surface of the image capture device 100 may include a drainage channel 134. A bottom surface of the image capture device 100 may include an interconnect mechanism 136 for connecting the image capture device 100 to a handle grip or other securing device. In the example shown in FIG. 1B, the interconnect mechanism 136 includes folding protrusions configured to move between a nested or collapsed position as shown and an extended or open position (not shown) that facilitates coupling of the protrusions to mating protrusions of other devices such as handle grips, mounts, clips, or like devices.

The image capture device 100 may include an interactive display 138 that allows for interaction with the image capture device 100 while simultaneously displaying information on a surface of the image capture device 100.

The image capture device 100 of FIGS. 1A-B includes an exterior that encompasses and protects internal electronics. In the present example, the exterior includes six surfaces (i.e. a front face, a left face, a right face, a back face, a top face, and a bottom face) that form a rectangular cuboid. Furthermore, both the front and rear surfaces of the image capture device 100 are rectangular. In other embodiments, the exterior may have a different shape. The image capture device 100 may be made of a rigid material such as plastic, aluminum, steel, or fiberglass. The image capture device 100 may include features other than those described here. For example, the image capture device 100 may include additional buttons or different interface features, such as interchangeable lenses, cold shoes, and hot shoes that can add functional features to the image capture device 100.

The image capture device 100 may include various types of image sensors, such as charge-coupled device (CCD) sensors, active pixel sensors (APS), complementary metal-oxide-semiconductor (CMOS) sensors, N-type metal-oxide-semiconductor (NMOS) sensors, and/or any other image sensor or combination of image sensors.

Although not illustrated, in various embodiments, the image capture device 100 may include other additional electrical components (e.g., an image processor, camera system-on-chip (SoC), etc.), which may be included on one or more circuit boards within the body 102 of the image capture device 100.

The image capture device 100 may interface with or communicate with an external device, such as an external user interface device (not shown), via a wired or wireless computing communication link (e.g., the I/O interface 124). Any number of computing communication links may be used. The computing communication link may be a direct computing communication link or an indirect computing communication link, such as a link including another device or a network, such as the internet, may be used.

In some implementations, the computing communication link may be a Wi-Fi link, an infrared link, a Bluetooth (BT) link, a cellular link, a ZigBee link, a near field communications (NFC) link, such as an ISO/IEC 20643 protocol link, an Advanced Network Technology interoperability (ANT+) link, and/or any other wireless communications link or combination of links.

In some implementations, the computing communication link may be an HDMI link, a USB link, a digital video interface link, a display port interface link, such as a Video Electronics Standards Association (VESA) digital display interface link, an Ethernet link, a Thunderbolt link, and/or other wired computing communication link.

The image capture device 100 may transmit images, such as panoramic images, or portions thereof, to the external user interface device via the computing communication link, and the external user interface device may store, process, display, or a combination thereof the panoramic images.

The external user interface device may be a computing device, such as a smartphone, a tablet computer, a phablet, a smart watch, a portable computer, personal computing device, and/or another device or combination of devices configured to receive user input, communicate information with the image capture device 100 via the computing communication link, or receive user input and communicate information with the image capture device 100 via the computing communication link.

The external user interface device may display, or otherwise present, content, such as images or video, acquired by the image capture device 100. For example, a display of the external user interface device may be a viewport into the three-dimensional space represented by the panoramic images or video captured or created by the image capture device 100.

The external user interface device may communicate information, such as metadata, to the image capture device 100. For example, the external user interface device may send orientation information of the external user interface device with respect to a defined coordinate system to the image capture device 100, such that the image capture device 100 may determine an orientation of the external user interface device relative to the image capture device 100.

Based on the determined orientation, the image capture device 100 may identify a portion of the panoramic images or video captured by the image capture device 100 for the image capture device 100 to send to the external user interface device for presentation as the viewport. In some implementations, based on the determined orientation, the image capture device 100 may determine the location of the external user interface device and/or the dimensions for viewing of a portion of the panoramic images or video.

The external user interface device may implement or execute one or more applications to manage or control the image capture device 100. For example, the external user interface device may include an application for controlling camera configuration, video acquisition, video display, or any other configurable or controllable aspect of the image capture device 100.

The user interface device, such as via an application, may generate and share, such as via a cloud-based or social media service, one or more images, or short video clips, such as in response to user input. In some implementations, the external user interface device, such as via an application, may remotely control the image capture device 100 such as in response to user input.

The external user interface device, such as via an application, may display unprocessed or minimally processed images or video captured by the image capture device 100 contemporaneously with capturing the images or video by the image capture device 100, such as for shot framing or live preview, and which may be performed in response to user input. In some implementations, the external user interface device, such as via an application, may mark one or more key moments contemporaneously with capturing the images or video by the image capture device 100, such as with a tag or highlight in response to a user input or user gesture.

The external user interface device, such as via an application, may display or otherwise present marks or tags associated with images or video, such as in response to user input. For example, marks may be presented in a camera roll application for location review and/or playback of video highlights.

The external user interface device, such as via an application, may wirelessly control camera software, hardware, or both. For example, the external user interface device may include a web-based graphical interface accessible by a user for selecting a live or previously recorded video stream from the image capture device 100 for display on the external user interface device.

The external user interface device may receive information indicating a user setting, such as an image resolution setting (e.g., 3840 pixels by 2160 pixels), a frame rate setting (e.g., 60 frames per second (fps)), a location setting, and/or a context setting, which may indicate an activity, such as mountain biking, in response to user input, and may communicate the settings, or related information, to the image capture device 100.

The image capture device 100 may be used to implement some or all of the techniques described in this disclosure, such as the technique the distribution of heat and the thermal architecture described herein.

Figure 2:
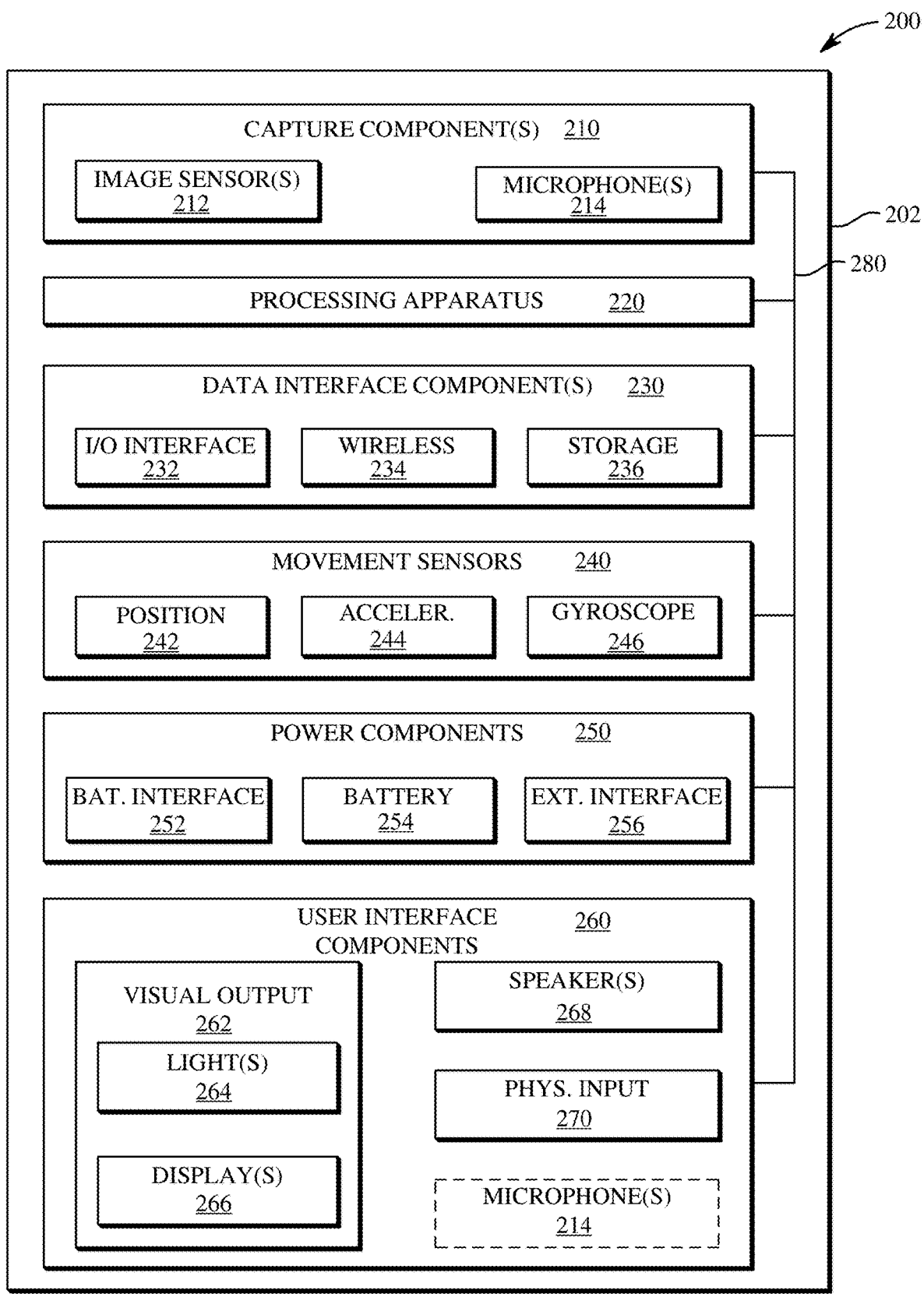
FIG. 2 is a block diagram of electronic components of an image capture device.

FIG. 2 is a block diagram of electronic components in an image capture device 200. The image capture device 200 may be a single-lens image capture device, a multi-lens image capture device, or variations thereof, including an image capture device with multiple capabilities such as use of interchangeable integrated sensor lens assemblies. The description of the image capture device 200 is also applicable to the image capture devices 100 of FIGS. 1A-B.

The image capture device 200 includes a body 202 which includes electronic components such as capture components 210, a processing apparatus 220, data interface components 230, movement sensors 240, power components 250, and/or user interface components 260.

The capture components 210 include one or more image sensors 212 for capturing images and one or more microphones 214 for capturing audio.

The image sensor(s) 212 is configured to detect light of a certain spectrum (e.g., the visible spectrum or the infrared spectrum) and convey information constituting an image as electrical signals (e.g., analog or digital signals). The image sensor(s) 212 detects light incident through a lens coupled or connected to the body 202. The image sensor(s) 212 may be any suitable type of image sensor, such as a charge-coupled device (CCD) sensor, active pixel sensor (APS), complementary metal-oxide-semiconductor (CMOS) sensor, N-type metal-oxide-semiconductor (NMOS) sensor, and/or any other image sensor or combination of image sensors. Image signals from the image sensor(s) 212 may be passed to other electronic components of the image capture device 200 via a bus 280, such as to the processing apparatus 220. In some implementations, the image sensor(s) 212 includes a digital-to-analog converter. A multi-lens variation of the image capture device 200 can include multiple image sensors 212.

The microphone(s) 214 is configured to detect sound, which may be recorded in conjunction with capturing images to form a video. The microphone(s) 214 may also detect sound in order to receive audible commands to control the image capture device 200.

The processing apparatus 220 may be configured to perform image signal processing (e.g., filtering, tone mapping, stitching, and/or encoding) to generate output images based on image data from the image sensor(s) 212. The processing apparatus 220 may include one or more processors having single or multiple processing cores. In some implementations, the processing apparatus 220 may include an application specific integrated circuit (ASIC). For example, the processing apparatus 220 may include a custom image signal processor. The processing apparatus 220 may exchange data (e.g., image data) with other components of the image capture device 200, such as the image sensor(s) 212, via the bus 280.

The processing apparatus 220 may include memory, such as a random-access memory (RAM) device, flash memory, or another suitable type of storage device, such as a non-transitory computer-readable memory. The memory of the processing apparatus 220 may include executable instructions and data that can be accessed by one or more processors of the processing apparatus 220. For example, the processing apparatus 220 may include one or more dynamic random-access memory (DRAM) modules, such as double data rate synchronous dynamic random-access memory (DDR SDRAM). In some implementations, the processing apparatus 220 may include a digital signal processor (DSP). More than one processing apparatus may also be present or associated with the image capture device 200.

The data interface components 230 enable communication between the image capture device 200 and other electronic devices, such as a remote control, a smartphone, a tablet computer, a laptop computer, a desktop computer, or a storage device. For example, the data interface components 230 may be used to receive commands to operate the image capture device 200, transfer image data to other electronic devices, and/or transfer other signals or information to and from the image capture device 200. The data interface components 230 may be configured for wired and/or wireless communication. For example, the data interface components 230 may include an I/O interface 232 that provides wired communication for the image capture device, which may be a USB interface (e.g., USB type-C), a high-definition multimedia interface (HDMI), or a FireWire interface. The data interface components 230 may include a wireless data interface 234 that provides wireless communication for the image capture device 200, such as a Bluetooth interface, a ZigBee interface, and/or a Wi-Fi interface. The data interface components 230 may include a storage interface 236, such as a memory card slot configured to receive and operatively couple to a storage device (e.g., a memory card) for data transfer with the image capture device 200 (e.g., for storing captured images and/or recorded audio and video).

The movement sensors 240 may detect the position and movement of the image capture device 200. The movement sensors 240 may include a position sensor 242, an accelerometer 244, or a gyroscope 246. The position sensor 242, such as a global positioning system (GPS) sensor, is used to determine a position of the image capture device 200. The accelerometer 244, such as a three-axis accelerometer, measures linear motion (e.g., linear acceleration) of the image capture device 200. The gyroscope 246, such as a three-axis gyroscope, measures rotational motion (e.g., rate of rotation) of the image capture device 200. Other types of movement sensors 240 may also be present or associated with the image capture device 200.

The power components 250 may receive, store, and/or provide power for operating the image capture device 200. The power components 250 may include a battery interface 252 and a battery 254. The battery interface 252 operatively couples to the battery 254, for example, with conductive contacts to transfer power from the battery 254 to the other electronic components of the image capture device 200. The power components 250 may also include an external interface 256, and the power components 250 may, via the external interface 256, receive power from an external source, such as a wall plug or external battery, for operating the image capture device 200 and/or charging the battery 254 of the image capture device 200. In some implementations, the external interface 256 may be the I/O interface 232. In such an implementation, the I/O interface 232 may enable the power components 250 to receive power from an external source over a wired data interface component (e.g., a USB type-C cable).

The user interface components 260 may allow the user to interact with the image capture device 200, for example, providing outputs to the user and receiving inputs from the user. The user interface components 260 may include visual output components 262 to visually communicate information and/or present captured images to the user. The visual output components 262 may include one or more lights 264 and/or more displays 266. The display(s) 266 may be configured as a touch screen that receives inputs from the user. The user interface components 260 may also include one or more speakers 268. The speaker(s) 268 can function as an audio output component that audibly communicates information and/or presents recorded audio to the user. The user interface components 260 may also include one or more physical input interfaces 270 that are physically manipulated by the user to provide input to the image capture device 200. The physical input interfaces 270 may, for example, be configured as buttons, toggles, or switches. The user interface components 260 may also be considered to include the microphone(s) 214, as indicated in dotted line, and the microphone(s) 214 may function to receive audio inputs from the user, such as voice commands.

Figure 3A:
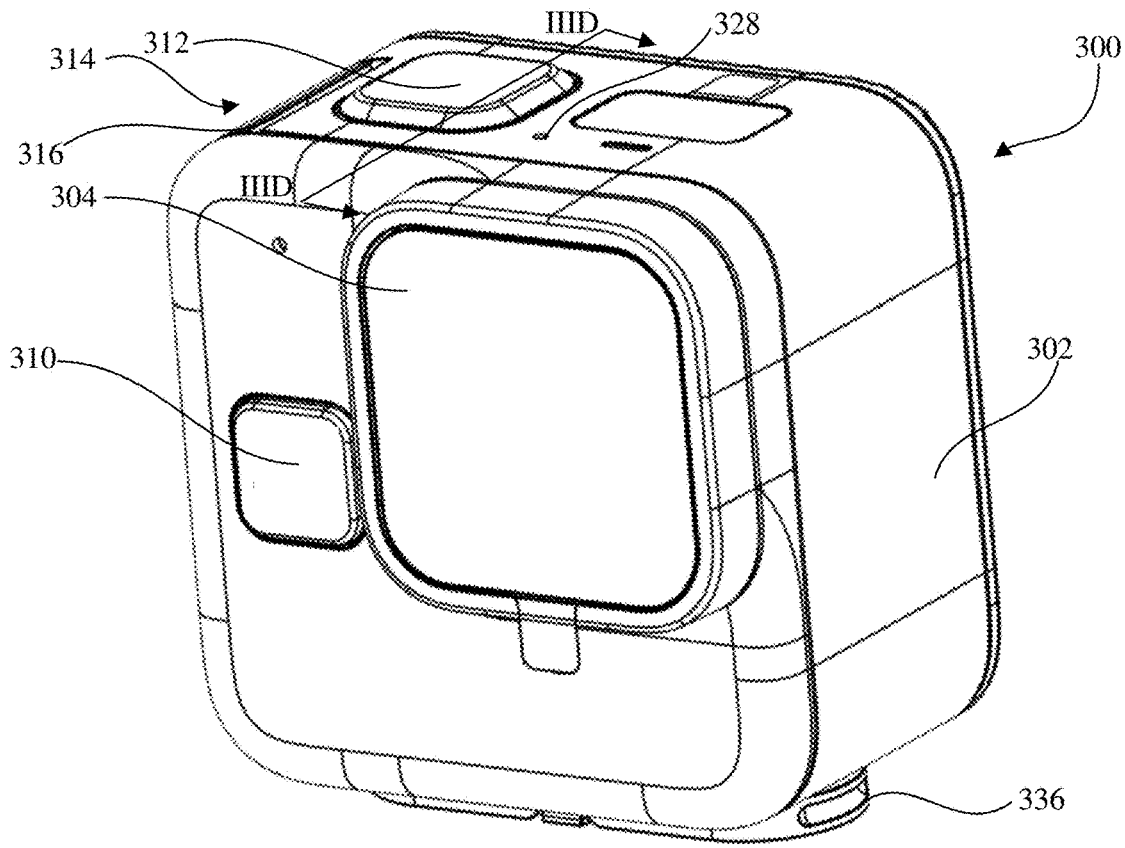
FIG. 3A is a front isometric view of an image capture device.

FIG. 3A is a front isometric view of an image capture device 300, the teachings of which are also applicable to the image capture devices 100, 200 of FIGS. 1A-1B and FIG. 2. The image capture device 300 includes a body 302. The body 302 forms an exterior of the image capture device 300. The body 302 is one monolithic piece including a front wall, top wall, bottom wall, first side wall, second side wall, or a combination thereof. A lens 304 extends from the body 302 so that images may be captured with the image capture device 300. The image capture device may be pared to another device by a button 310.

The button 310 may be operated remotely or by contact with the button 310. The button 310 may pair the image capture device 300 with another device such as a tablet, smart device, computer, or a combination thereof. The smart device or other device may control the image capture device 300 remotely. The button 310 may enable a user to turn on near-net communications (e.g., Bluetooth). The button 310 may be used in combination with a shutter button 312 or in lieu of the shutter button 312.

The shutter button 312 may control the lens 304, image capture, or both. The shutter button 312 may operate the image capture device 300 when the shutter button 312 is depressed by a user. The shutter button 312 may be located proximate to a door 314.

The door 314 may open and close so that a user may access internal components. The door 314 may cover a charging port, a memory card, a data port, a USB port, or a combination thereof. The door 314 may be rotated open about a hinge mechanism 316. The hinge mechanism 316 and the door 314 may form a seal when closed. The door 314 may lock and prevent fluids from entering the image capture device 300.

The image capture device 300 includes a microphone 328 that captures sound while images or videos are captured. The microphone 328 may be a single microphone or may be a plurality of microphones. The microphone 328 may be located on or within the body 302 of the image capture device. The body 302 may include a microphone 328 and one or more interconnect mechanisms, e.g., a base interconnect mechanism 336 and a rear interconnect mechanism 340.

The one or more interconnect mechanisms 336, 340 assist in connecting the image capture device 300 to another device such as a gimbal, a stand, a tripod, a movable object, a helmet, or a combination thereof. The one or more interconnect mechanisms 336, 340 may be movable between a stored position (as shown) and a connectable position. The front of the image capture device 300 may be free of screens. For example, there may be no screen on a front of the image capture device 300 to view images or video captured by the image capture device 300.

Figure 3B:
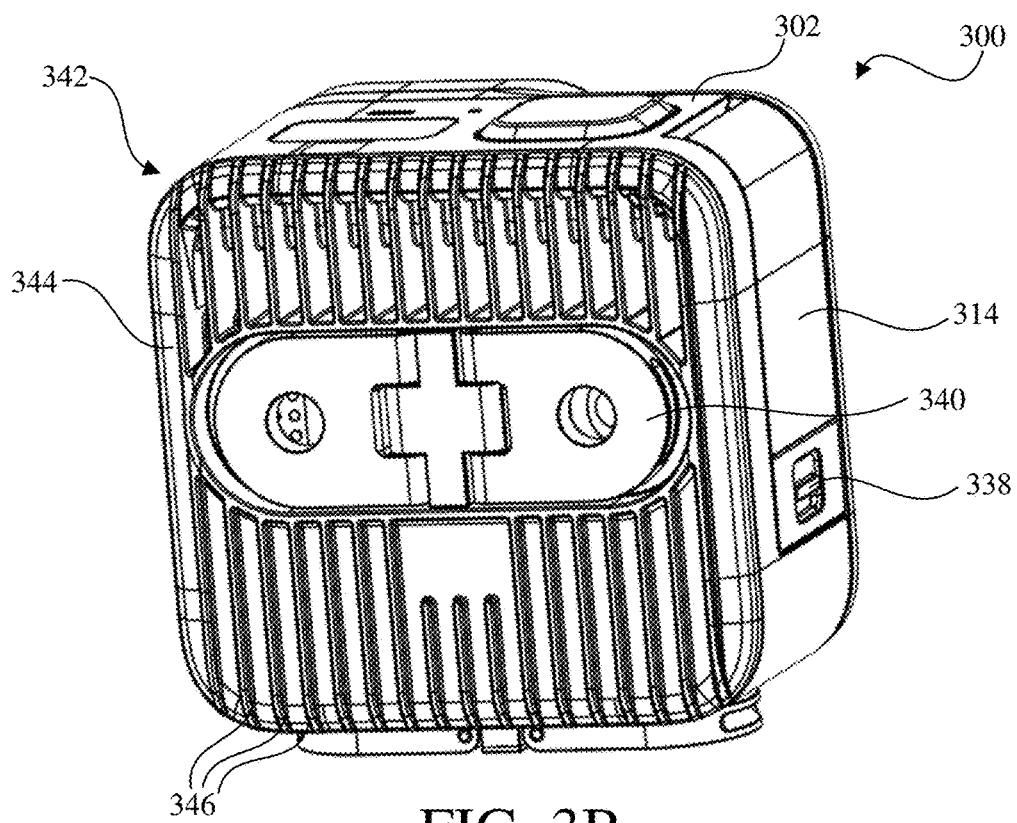
FIG. 3B is a rear isometric view of the image capture device of FIG. 3A.

FIG. 3B is a rear isometric view of the image capture device 300 of FIG. 3A. The image capture device 300 includes a body 302. A latch mechanism 338 is located in housing 302 adjacent the door 314 and the latch mechanism 338 releasably holds the door 314 in place with respect to the body 302. The latch mechanism 338 is actuatable between a locked position and an unlocked position. The latch mechanism 338 slides downward to release the door 314. The door 314 and the latch mechanism 338 are located primarily on one side of the body 302. A rear interconnect mechanism 340 is located on a rear of the body 302 proximate to the latch mechanism 338.

The rear interconnect mechanism 340 is virtually identical to the base interconnect mechanism 336 of FIG. 3A. The rear interconnect mechanism 340 is movable between a stored position (as shown) and a connectable position. The rear interconnect mechanism 340 may connect the image capture device 300 to some other structure (e.g., a gimbal, a helmet, a tripod) in a different orientation than possible with the base interconnect mechanism 336. The rear interconnect mechanism 340 may be located within or connected to a rear wall 342 of the image capture device 300.

The rear wall 342 forms part of the body 302. The rear wall 342 may be a discrete part of the body 302 that is separate from the monolithic portion of the body 302. The monolithic portion of the body 302 may be made of a polymer and the rear wall 342 may be made of metal. The rear 342 may form a rear outer most portion of the body 302. The rear wall 342 may be made of or include conductive material. The rear wall 342 may be made of or include a ferrous material, steel, iron, copper, silver, nickel, aluminum, or a combination thereof. The rear wall 342 may be formed by or include a rear heatsink 344.

The rear heatsink 344 may move heat from heat generating devices within the image capture device 300 to ambient air that is located around the image capture device 300. The rear heatsink 344 may be directly or indirectly connected to internal components of the image capture device 300. The rear heatsink 344 may be solid metal. The rear heatsink 344 may be connected to the rear interconnect mechanism 340 and the rear interconnect mechanism 340 may function as part of the rear heatsink 344. The rear interconnect mechanism 340, when in the extended or connectable position (not shown), may dissipate heat, transfer heat to another device, or a combination thereof. The rear heatsink 344 may include a plurality of fins 346.

The fins 346 may project outward so that as air passes over the fins 346, heat is transferred from the image capture device 300 into the ambient air. When the image capture device is in motion or subjected to moving air, the fins 346 may create turbulent flow to increase an amount of heat removed from the image capture device 300. The fins 346 may be configured such that air flowing across the fins 346 has a laminar flow or a turbulent flow so that air is heated as the air passes over the rear heatsink 344. The fins 346 may be made of a same material as the rear heatsink 344. The fins 346 may be made of a more conductive material than the rear heatsink 344. The fins 346 and the rear heatsink 344 may be one monolithic piece. The rear heatsink 344 may accept heat from one or more heat generating devices and transfer the heat into the fins 346 to release the heat. The rear heatsink 344 may be in direct or indirect contact with the heat generating devices (e.g., as shown in FIG. 3C).

Figure 3C:
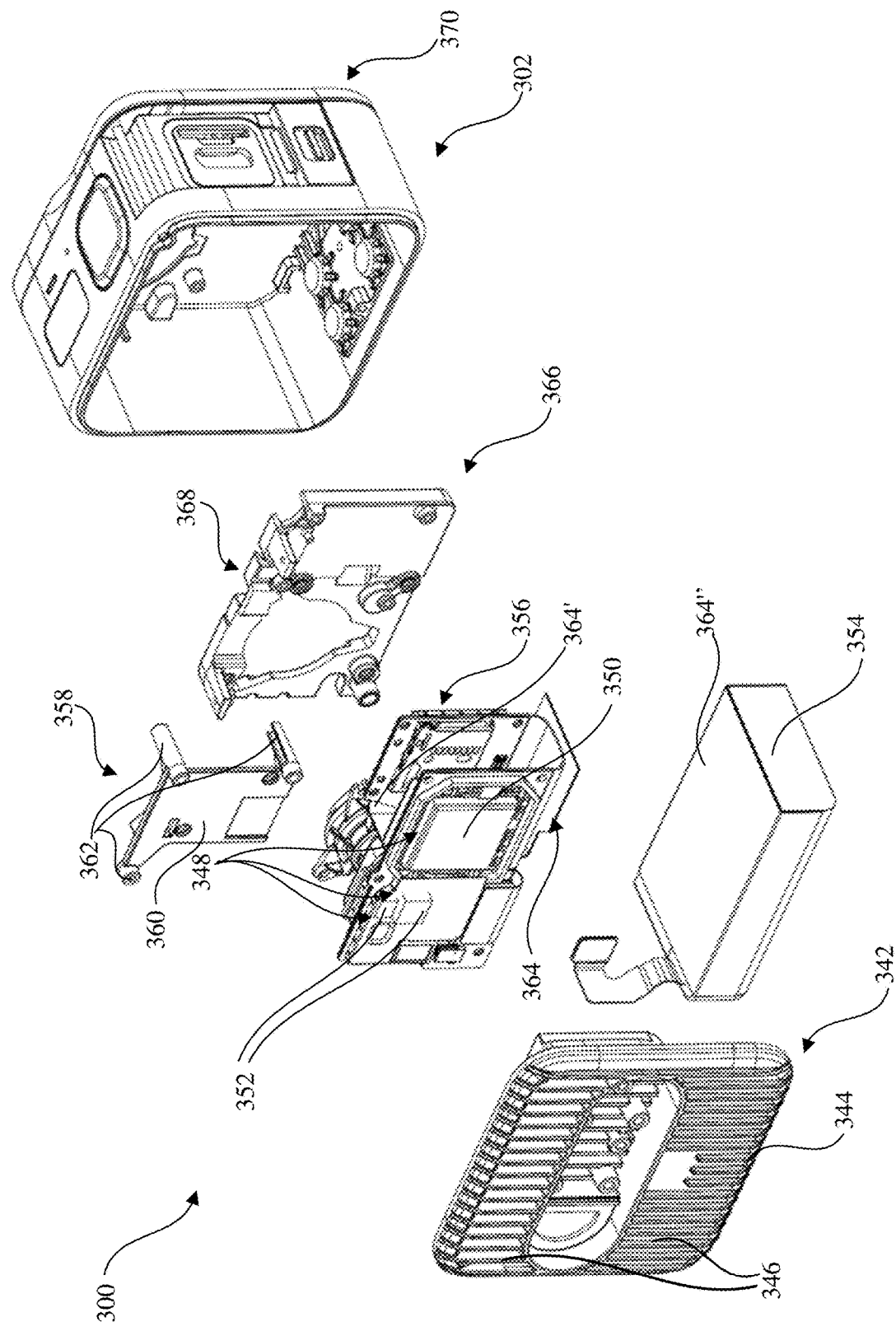
FIG. 3C is a partially exploded view of the image capture device of FIG. 3A.

FIG. 3C illustrates a rear partially exploded view of portions of the image capture device 300 of FIGS. 3A-3B. A rear of the image capture device 300 includes the rear wall 342, which is the rear heatsink 344 (e.g., the rear heatsink 344 forms the entire rear wall 342). The rear heatsink 344 may be free of any covers. The rear heatsink 344 may be exposed to air, be in contact with ambient conditions surrounding the image capture device 300, or both. The rear heatsink 344 may direct thermal energy into the ambient through the fins 346. The rear heatsink 344 connects to a rear side of the body 302 so that heat generating devices 348 located within the body 302 may dissipate thermal energy through the rear heatsink 344.

The heat generating devices 348 are internal components of the image capture device 300. The heat generating devices 348 may generate heat when the image capture device 300 is operating. The heat generating devices 348 may generate heat that over time may build up within the image capture device 300. If too much heat builds up, the heat generating devices 348, the image capture device 300, or both may begin to have impaired operation or may shut down.

The heat generating devices 348 may include one or more system on chips (SOCs) 350, one or more power management integrated circuits (PMICs) 352, or both. The SOCs 350 may operate to capture images, store images, store sound, process images, or a combination thereof. The SOCs 350 may operate an ISLA (not shown) to capture images. The SOCs 350 may be a single SOC 350. The SOCs 350 may be in communication with the PMICs 352 or work in conjunction with the PMICs 352.

The PMICs 352 may manage power of the image capture device 300. The PMICs 352 may charge one or more batteries 354, reduce power of the batteries 354, control usage of the batteries 354, alternate between batteries 354, or a combination thereof. The PMICs 352 may control how and where power is distributed through the image capture device 300. The PMICs 352 may generate heat as the PMICs 352 operate. The SOC 350 and the PMICs 352 may be in direct contact or indirect contact with an interior surface of the rear heatsink 344. First sides of the SOC 350 and the PMICs 352 may be in thermal communication with the interior surface of the rear heatsink 344. Second sides of the SOC 350 and the PMICs 352 may be in contact with a printed circuit board (PCB) 356 or other component and may face a chassis 358 of the image capture device 300.

Thermal energy from the SOC 350 and the PMICs 352 may be insulated from the chassis 358 by the PCB 356. The chassis 358 may be indirectly thermally connected with the SOC 350, the PMICs 352, or both. The chassis 358 may have a body contact surface 360 and legs 362.

The body contact surface 360 may be a front surface, a rear surface, or both surfaces of the chassis 358. The body contact surface 360 may be a body portion between a front surface and a rear surface of the chassis 358. The body contact surface 360 may be any surface of the chassis 358 in contact with heat spreaders 364, 364', or 364" shown in detail in FIG. 3D (e.g., to form the indirect connection between the SOC 350, the PMICs 352, or both and the body contact surface 360). The body contact surface 360 may distribute thermal energy from the body contact surface 360 through legs 362 and into a front heatsink 366; into the heat spreaders 364, 364', or 364"; or a combination thereof.

The legs 362 may connect the chassis 358 within the image capture device 300. The legs 362 may form a fixed connection, distribute thermal energy, or both. The legs 362 may extend axially outward from the body contact surface 360 so that the chassis 358 is suspended within the image capture device 300. The legs 362 may directly connect to the front heatsink 366, a forward circuit such as a rigid flexible printed circuit board (RFPC) 374, or both (e.g., the legs may rest on the RFPC 374).

The front heatsink 366 may assist in distributing or storing heat generated by the heat generating devices 348. The front heatsink 366 may distribute or store thermal energy from the SOC 350, the PMICs 352, or both. The front heatsink 366 may include a through hole 368 that a lens of an ISLA (not shown) extends through. The front heatsink 366 may distribute some of the heat generated within the image capture device 300 to a forward side of the image capture device 300 so that the image capture device 300 is thermally stable (e.g., does not turn off due to overheating).

The front heatsink 366 and the rear heatsink 344 may be relatively a same size, shape, mass, or a combination thereof. The rear heatsink 344 may have a mass that is greater than a mass of the front heatsink 366. The rear heatsink 344 and the front heatsink 366 may have a ratio of masses. The ratio of mass of the rear heatsink 344 to the front heatsink 366 may be about 1:1, about 1.5:1 or more, about 2:1 or more, about 2.5:1 or more, or about 3:1 or more. The ratio of mass of the rear heatsink 344 to the front heatsink 366 may be about 10:1 or less, about 7:1 or less, about 5:1 or less, or about 4:1 or less. The rear heatsink 344 may hold about 20 percent or more, about 30 percent or more, about 40 percent or more, about 50 percent or more, or even about 60 percent or more of a thermal load of the image capture device 300. The rear heatsink 344 may hold about double a thermal load or more or about triple a thermal load or more of the front heatsink 366. The front heatsink 366 may be located behind a front wall 370 (as shown is removed from the side walls to demonstrate a stack up of the components) of the image capture device 300.

The front wall 370 may cover the front heatsink 366 so that the front heatsink 366 is concealed from view. The front wall 370 may be thermally insulative. The front wall 370 may be thermally conductive. The front wall 370 may protect the front heatsink 366. The front wall 370 may prevent fluids from entering the image capture device 300, protect against drops (e.g., shocks if the image capture device 300 is jostled or dropped), or both. The front wall 370 may be a monolithic part of the body 302 (e.g., front wall 370, top wall, bottom wall, first side wall, and second side wall). The front wall 370 may be made of or include a polymer, an elastomer, a rubber, a polycarbonate, metal, steel, iron, or a combination thereof.

Figure 3D:
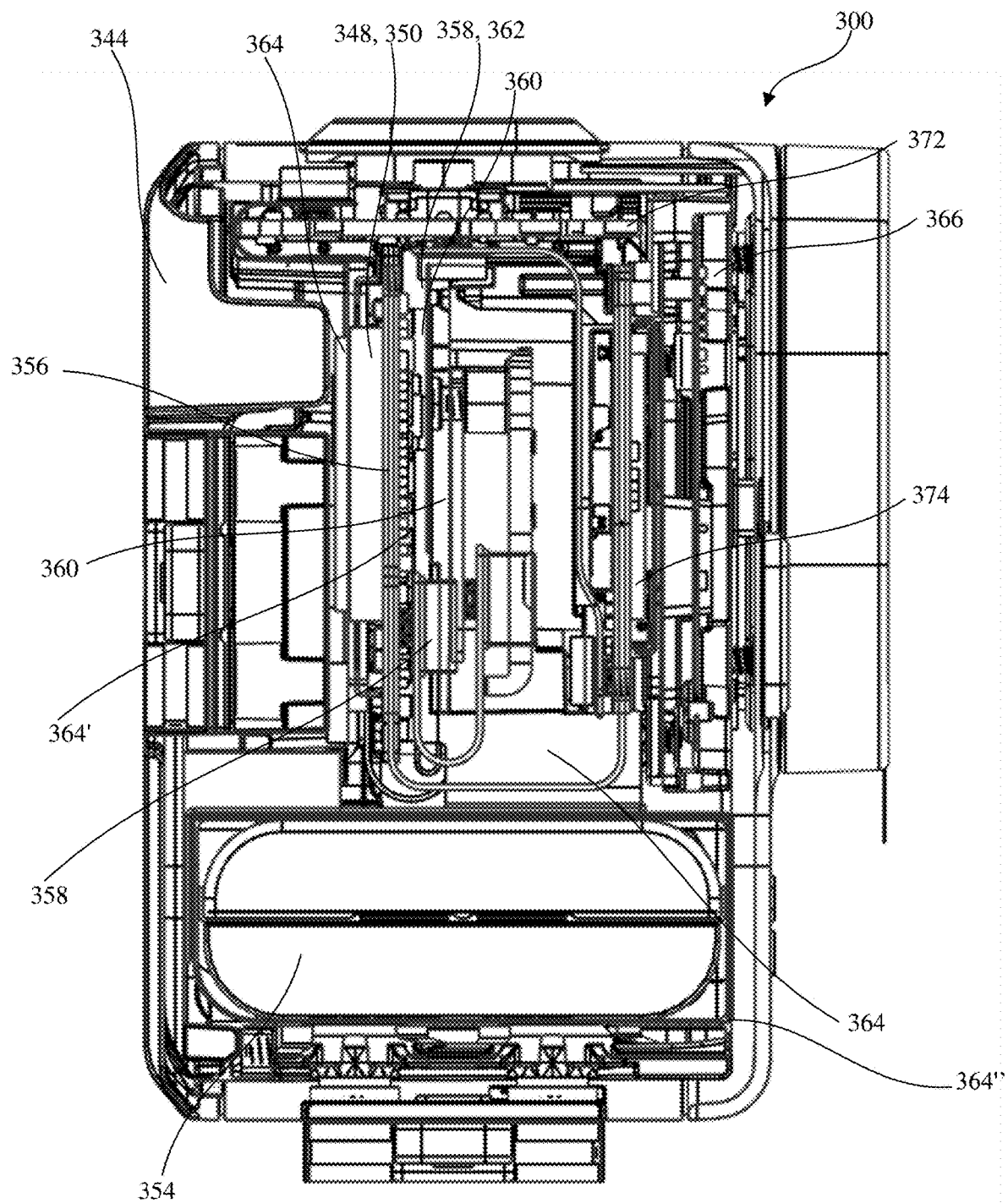
FIG. 3D is a cross-sectional view of FIG. 3A along line IIID-IIID.

FIG. 3D is a cross-sectional view of FIG. 3A along lines IIID-IIID. The image capture device 300 includes the rear heatsink 344 located at a rear end. The rear heatsink 344 is in thermal communication with the SOC 350 so that at least some of the thermal energy from operation of the SOC 350 is transferred to the rear heatsink 344. FIG. 3D illustrates a multitude of heat spreaders and relationships within the image capture device 300 such as a sensor heat spreader 364, a front heat spreader 364', and a battery heat spreader 364". The sensor heat spreader 364 extends adjacent the rear heatsink 344 and the SOC 350 to assist in transferring thermal energy to the rear heatsink 344, the battery 354, or both. The sensor heat spreader 364 may be flexible so that the sensor heat spreader 364 may bend around internal components, conform to the internal components, or both. The sensor heat spreader 364 may be connected to the image sensor (e.g., 212 of FIG. 2) by a thermal interface material (TIM) (not shown) that assists in transferring heat from the image sensor 212 to the sensor heat spreader 364. The sensor heat spreader 364 may extend from a top of the image capture device 300 to a bottom of the image capture device 300. The sensor heat spreader 364 may be made of or include a conductive material. The sensor heat spreader 364 may have a higher coefficient of thermal transfer than the rear heatsink 344, the SOC 350, or both. The sensor heat spreader 364 may be made of or include carbon, graphite, graphene, silver, aluminum, nickel, or a combination thereof. The sensor heat spreader 364 may be a woven material, a film, an extruded material, a pressed material, or a combination thereof. The sensor heat spreader 364 may be compressible. The sensor heat spreader 364 may be incompressible and may be connected to the rear heatsink 344 on a first side and connected to the SOC 350 on a second side.

The first side of the SOC 350 is in communication with the rear heatsink 344. The second side of the SOC 350 may be in communication with the chassis 358. The SOC 350 and the chassis 358 may be in direct communication (e.g., via a TIM). The SOC 350 may be connected to the PCB 356 and the PCB 356 may be connected to the chassis 358. The sensor heat spreader 364 may be located between a heat generating device such as the image sensor 212 and the chassis 358. The sensor heat spreader 364 may spread heat from an upper region (e.g., close to a top of the image capture device 300) to a lower region (e.g., close to a bottom of the image capture device 300). The sensor heat spreader 364 may extend past the chassis 358 and into communication with the battery 354 (e.g., spread heat from a heat generating device such as an image sensor to the battery).

The chassis 358 includes the body contact surface 360. The body contact surface 360 has a surface area that is sufficiently large to pull thermal energy away from the SOC 350 or other internal components so that the SOC 350 or other internal components remain within an operating temperature, to store thermal energy, to dissipate thermal energy, or a combination thereof. For example, the body contact surface 360 may be able to pull enough thermal energy away from the SOC 350 so that the SOC 350 may not exceed a predetermined temperature. The body contact surface 360 has an area that is a same size or larger than an area of the SOC 350. The one or more legs 362 may extend from the body contact surface 360 to connect the chassis 358 within the image capture device 300.

The legs 362 may connect the chassis 358 to the RFPC 374 (e.g., screws may extend through the RFPC 374 so that the legs 362 and the chassis 358 are connected). The legs 362 may suspend the body contact surface 360 within a central part of the image capture device 300. The legs 362 may thermally connect (e.g., indirectly) the chassis 358 to the front heatsink 366 so that the legs 362 assist in transferring thermal energy to the front heatsink 366. For example, some thermal energy may pass from the legs 362 to the front heatsink 366 via fasteners (not shown). The chassis 358 may include one or more legs 362, two or more legs 362, or three or more legs 362. The legs 362 may extend from a rear end of the image capture device 300 toward a forward end of the image capture device 300. An upper printed circuit board 372 (upper PCB 372) may extend above the chassis 358, above the legs 362, or both. The chassis 358 may be in communication (e.g., direct contact) with the front heatsink 366 and the front heatsink 366 may receive heat from the front heat spreader 364'.

The front heat spreader 364' may extend from one of the heat generating devices 348 (e.g., the SOC 350) into thermal communication with the front heatsink 366 so that thermal energy is distributed within the image capture device 300. The front heat spreader 364' may extend proximate to a forward circuit such as the RFPC 374. The front heat spreader 364' may extend between the RFPC 374 and a body contact surface 360 of the chassis 358. The heat generating devices 348 may be or include a sensor, a USB port, a USB-c port, a power port, a charging port, or a combination thereof. The front heat spreader 364' may be a same material as the sensor heat spreader 364 and may be a discrete part from the sensor heat spreader 364. The front heat spreader 364' may extend from a rear side of the image capture device 300 to a front side of the image capture device 300. The front heat spreader 364' may have a first end in communication with one or more of the heat generating devices 348 and a second end in communication with the chassis 358. The front heat spreader 364' may wrap around an inside of the image capture device 300. The front heat spreader 364' may extend from the front, around a side, and to the rear of the image capture device 300. The front heat spreader 364' may transfer heat to the front heatsink 366. The front heat spreader 364' and the sensor heat spreader 364 may be made of a same material as the battery heat spreader 364". The sensor heat spreader 364, the front heat spreader 364', and the battery heat spreader 364" may be in contact with one or more TIMs.

The battery heat spreader 364" may be in communication with the battery 354. The battery heat spreader 364" may be in communication with the sensor heat spreader 364. The sensor heat spreader 364 may directly or indirectly transfer thermal energy from the SOC 350 to the battery 354. The battery 354 may act as a heatsink to trap thermal energy, dissipate thermal energy, store thermal energy, or a combination thereof. For example, the sensor heat spreader 364 may indirectly remove thermal energy from the SOC 350 and transfer the thermal energy to the battery heat spreader 364". The battery heat spreader 364" may transfer the thermal energy to the battery 354. The battery heat spreader 364" may transfer thermal energy into the battery 354 so that thermal energy is moved towards a bottom of the image capture device 300. The battery heat spreader 364" may spread thermal energy out along one or more surfaces or two or more surfaces of the battery 354.

The battery 354 may be any battery that powers the image capture device 300. The battery 354 may be rechargeable, alkaline battery, lithium battery, magnesium battery, rechargeable lithium-metal battery, or a combination thereof. The battery 354 may be a single battery. The battery 354 may be multiple batteries combined together. The battery 354 is in direct contact with the battery heat spreader 364". The battery heat spreader 364" may be made of the same material and/or structure as the sensor heat spreader 364 and the front heat spreader 364'.

Figure 4A:
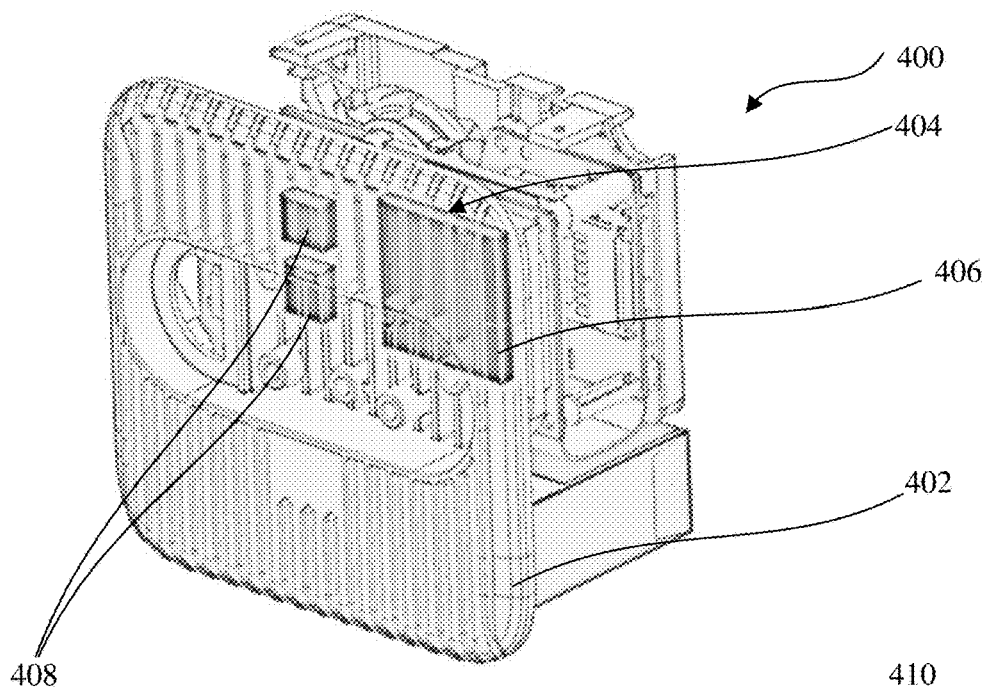
FIG. 4A is a rear isometric view of the image capture device of FIG. 3B with a rear heatsink and a housing in transparent so that heat generating components are visible.

FIG. 4A is an isometric rear view of the image capture device 400 with the rear heatsink 402 shown in transparent. As shown, heat generating devices 404 are visible within the image capture device 400 through the rear heatsink 402. The heat generating devices 404 are a system on chip (SOC) 406 and power management integrated circuits (PMICs) 408. The SOC 406 and PMICs 408 are located in communication with the rear heatsink 402 so that the thermal energy is quickly removed from the SOC 406 and PMICs 408 as the thermal energy is generated. The SOC 406, the PMICs 408, or both may be in communication with a TIM (not shown) that assists in forming a thermal connection with the rear heatsink 402 or a heat spreader taught herein (e.g., 364, 364', or 364" of FIG. 3D).

Figure 4B:
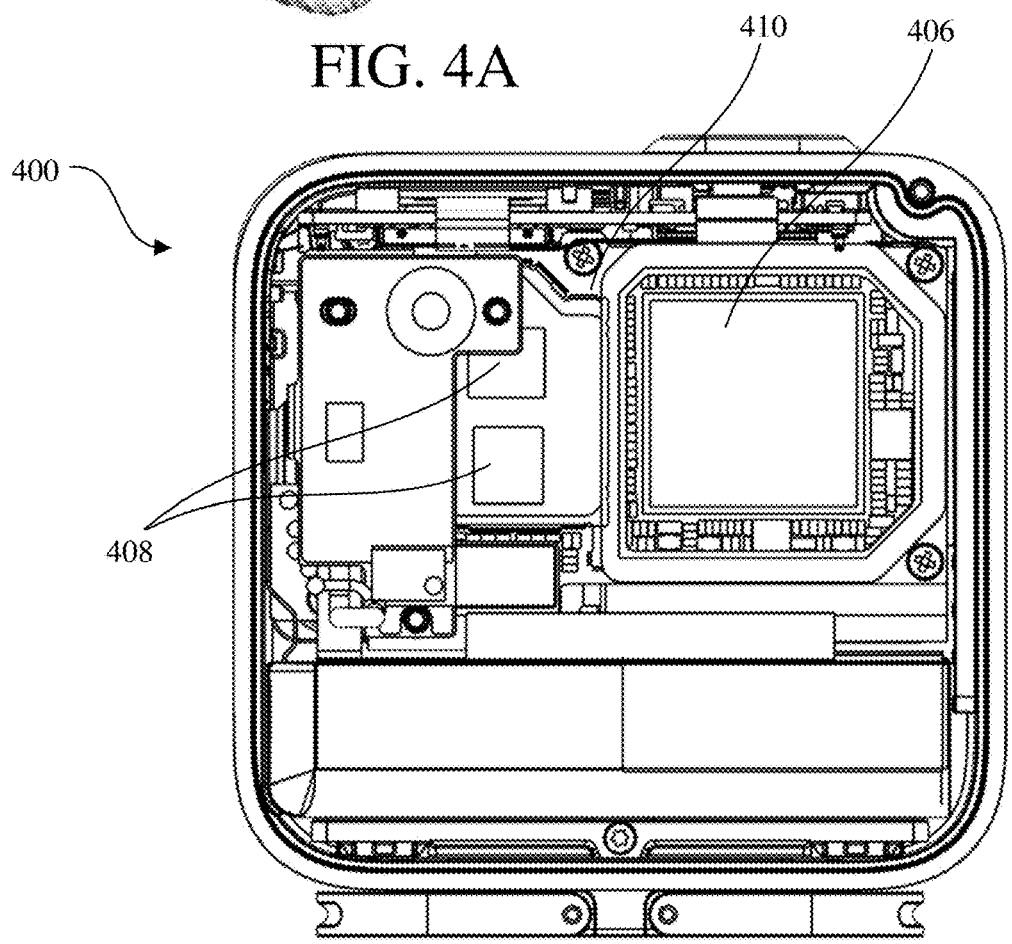
FIG. 4B is a rear view of the image capture device of FIG. 4A with the heat generating components exposed.

FIG. 4B is a rear plan view of the image capture device 400 of FIG. 4A with the rear heatsink 402 removed so that a relationship and size of the SOC 406 and the PMICs 408 are demonstrated relative to one another. As shown, the SOC 406 is larger than both of the PMICs 408. The SOC 406 has an area of about 2:1 or more, 3:1 or more, or even 4:1 or more than that of the PMIC 408, alone or in combination. The SOC 406 and PMICs 408 are all located on a printed circuit board (PCB) 410. The PCB 410 may assist in circulating thermal energy within the image capture device 400 so that thermal energy is equally distributed throughout the image capture device 400. A majority (e.g., 50 percent or more, 60% or more, or 70% or more of the total thermal energy) of the thermal energy of the image capture device 400 may be generated by the SOC 406 and PMICs 408. The thermal energy generated by SOC 406 and PMICs 408 may be transferred to the rear heatsink 402.

Figure 5A:
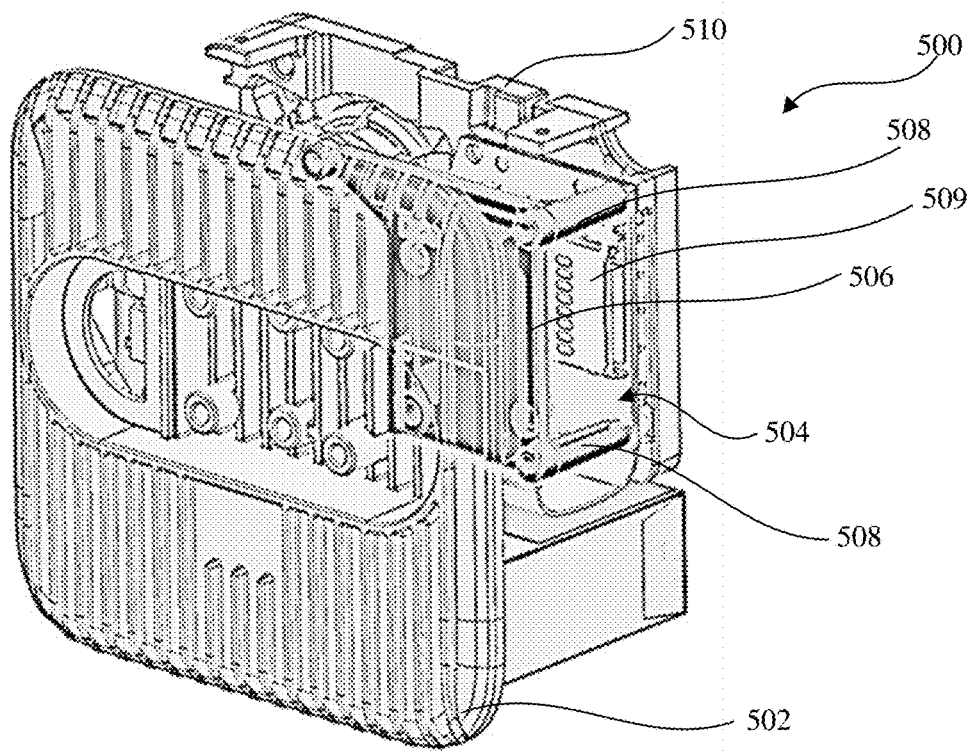
FIG. 5A is a rear isometric view of the image capture device of FIG. 3B with a rear heatsink and a housing in transparent so that a chassis is visible within the image capture device.

FIG. 5A is a rear isometric view of an image capture device 500 including a rear heatsink 502 shown in transparent so that a chassis 504 is visible through the rear heatsink 502. The chassis 504 includes a body contact surface 506 and legs 508. The legs 508 connect the chassis 504 to a forward circuit such as a rigid flexible printed circuit (RFCP) 509. The legs 508 may include fasteners (not shown) that may distribute heat to a front heatsink 510. The chassis 504 and the front heatsink 510 receive and distribute a thermal load within the image capture device 500.

Figure 5B:
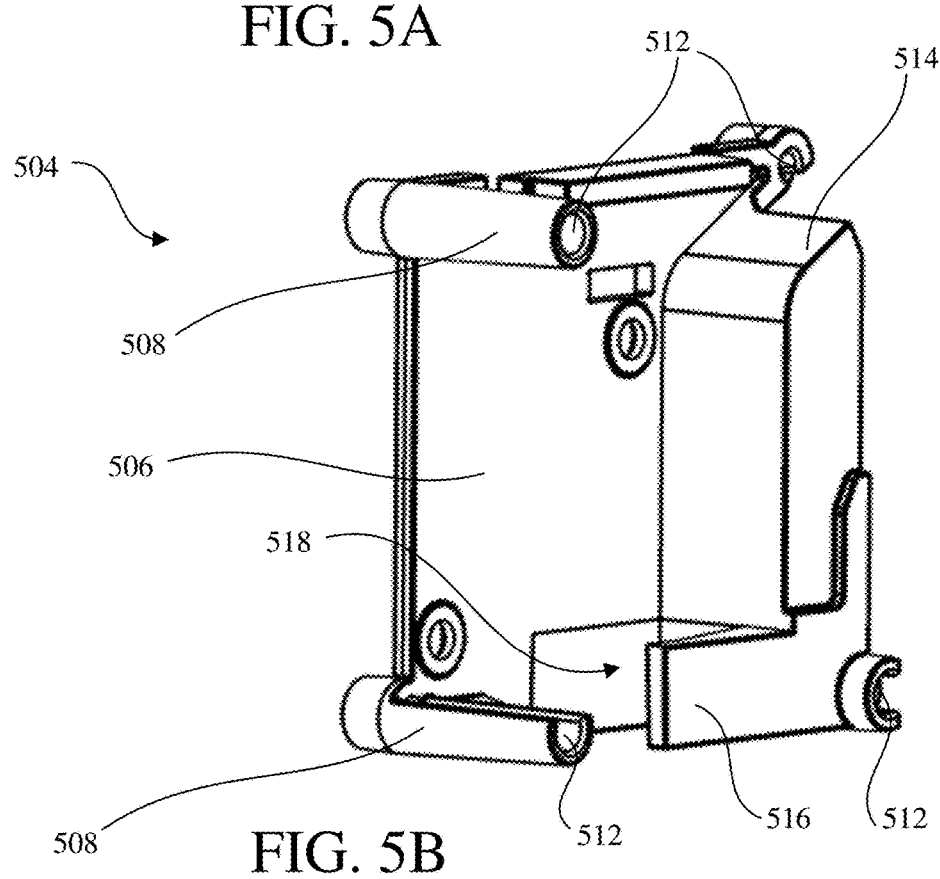
FIG. 5B is a front isometric view of the chassis of FIG. 5A.

FIG. 5B is a front isometric view of the chassis 504. The body contact surface 506 of the chassis 504 is a flat planar surface that receives thermal energy from other components (e.g., internal components within the image capture device 500) of the image capture device 500. The body contact surface 506 may be in thermal contact with one or more heat spreaders (e.g., 364, 364', or 364" of FIG. 3D). The body contact surface 506 may be in thermal communication with the SOC 350 (e.g., in direct contact or through a TIM). The body contact surface 506 may extend parallel to the heat generating devices 404 of FIGS. 4A-4B so that thermal energy from the heat generating devices 404 is transferred to the chassis 504 through the body contact surface 506 or the legs 508. The body contact surface 506 is connected to legs 508 that extend axially away from the body contact surface 506.

The legs 508 connect the chassis 504 to the RFCP 509 shown in FIG. 5A. The legs 508 may assist in transferring thermal energy from the chassis 504 into the front heatsink 510 or vice versa so that the thermal energy may be transferred to ambient air around the image capture device 500, balanced within the image capture device 300, or both. The legs 508 include recesses 512.

The recesses 512 assist in connecting the chassis 504 to the front heatsink 510. The recesses 512 may receive or include fasteners, adhesives, welding material, bolts, screws, threaded members, rivets, or a combination thereof. The recesses 512 may extend a full length of the legs 508. The recesses 512 may be threaded, smooth, tapered, porous, or a combination thereof. The recesses 512 may extend through or around a stabilization surface 514 instead of one or more of the legs 508.

The stabilization surface 514 may extend around one or more heat generating devices or support one or more heat generating devices (not shown) within the image capture device 500. The stabilization surface 514 may extend around all or a portion of an integrated sensor and lens assembly (ISLA) (not shown) so that the ISLA may be supported within the image capture device 500. The stabilization surface 514 may extend from the body contact surface 506 of the chassis. The body contact surface 506 may terminate at the stabilization surface 514. The stabilization surface 514 have a wall that is parallel to the body contact surface 506 and a wall that is perpendicular to the body contact surface 506. The stabilization surface 514 may be "L" shaped, "C" shaped, "U" shaped, symmetrical, geometric, non-geometric, non-symmetrical, have a tapered wall, or a combination thereof. The stabilization surface 514 may form a cavity. The stabilization surface 514 may be located on a side of the chassis 504 where the ISLA of the image capture device 500 extends. A foam, a thermally insulative member, or both may be compressed between the stabilization surface 514 and a heat generating device, a sensor, a printed circuit board, or a combination thereof to stabilize the heat generating device, the sensor, the printed circuit board, or a combination thereof within the image capture device 500. The stabilization surface 514 may be located on a forward side of the chassis 504, a left side of the chassis 504, a right side of the chassis 504, or a combination thereof. The chassis 504 may include one or more stabilization fingers 516.

The one or more stabilization fingers 516 may thermally connect the chassis 504 to one or more other heat generating devices discussed herein. The one or more stabilization fingers 516 may support one or more printed circuit boards. The stabilization fingers 516 be in contact with a foam, a thermally insulative material, or both that support a sensor, a heat generating device, a printed circuit board, or a combination thereof (not shown). The one or more stabilization fingers 516 may be directly connected to the body contact surface 506. The one or more stabilization fingers 516 may be connected to the stabilization surface 514. The one or more stabilization fingers 516 may extend in a direction opposite a cavity within the stabilization surface 514 extends. The one or more stabilization fingers 516 may extend parallel to the body contact surface 506.

A space 518 may be located between the stabilization fingers 516 and the body contact surface 506. One support device may extend into the space 518 to connect the contact fingers 516 to a sensor, a heat generating device, a printed circuit board, or a combination thereof. The space 518 may permit a connection on a first side and a second side of the stabilization finger 516.

Figure 5C:
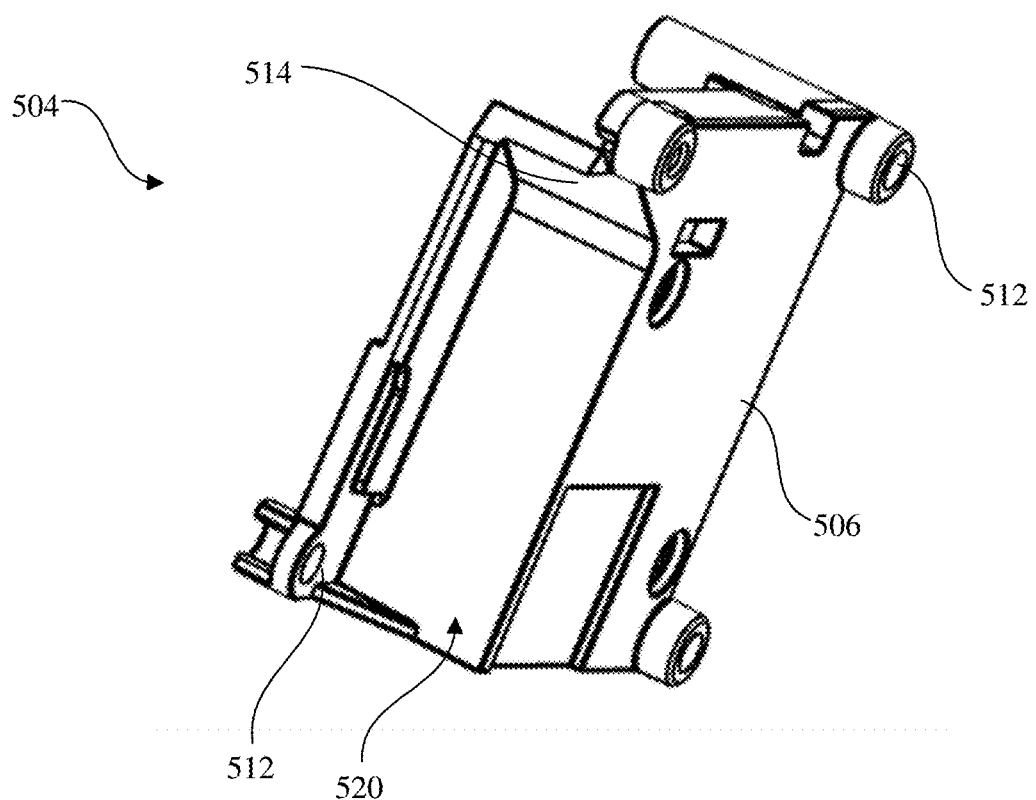
FIG. 5C is a rear isometric view of the chassis of FIG. 5A.

FIG. 5C is a rear isometric view of the chassis 504. The chassis 504 includes the body contact surface 506 and recesses 512 that extend through the chassis 504. The stabilization surface 514 is visible within the chassis 504. The stabilization surface 514 is a forward facing portion of the stabilization surface 514. The cavity 520 is sufficiently large to house one or more components, sensors, heat generating devices, lenses, or a combination thereof. The cavity 520 may extend around internal components of the image capture device 500, extend around the ISLA (not shown), support internal components, support the ISLA, or a combination thereof. The cavity 520 may be free of direct contact with any heat generating devices (e.g., a foam or a stabilization material may be in direct contact). The cavity 520 may increase an area of the chassis 504 without impeding components within the image capture device 500.

Figure 6A:
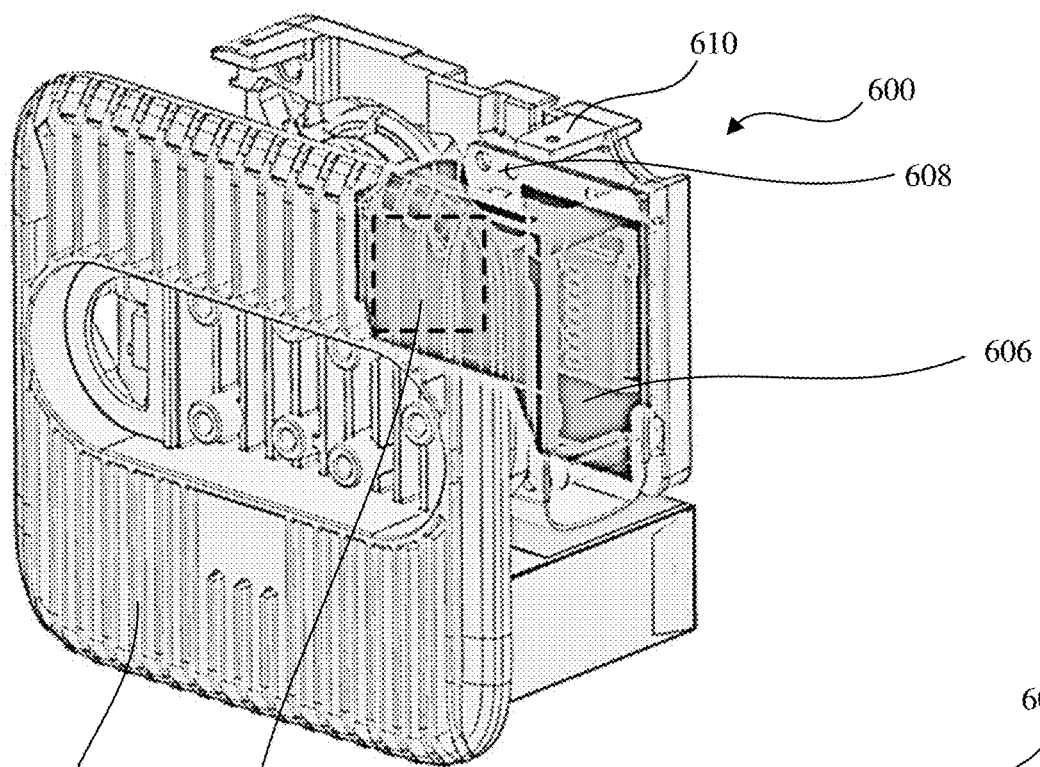
FIG. 6A is a rear isometric view of the image capture device of FIG. 3B with a rear heatsink and a housing in transparent so that a heat transfer device is visible that transfers heat from a heat generating component to the chassis of FIG. 5A.

FIG. 6A is an isometric rear view of an image capture device 600. The image capture device 600 includes a rear heatsink 602 that forms a rear wall of the image capture device 600. The rear heatsink 602 is located proximate to a system on chip (SOC) 604 and the rear heatsink 602 and SOC 604 are in thermal communication. The rear heatsink 602 extends along a first side of the SOC 604 and a front heat spreader 606 extends along a second side of the SOC 604. The front heat spreader 606 assist in transferring thermal energy from the SOC 604 to a chassis 608, a front heatsink 610, or both. The front heat spreader 606 is sandwiched between the chassis 608 and the front heatsink 610 so that the thermal energy from the SOC 604 is distributed to both the chassis 608 and the front heatsink 610. The front heatsink 610 is in direct thermal contact with the front heat spreader 606. The front heat spreader 606 is generally "U" shaped and extends from a front of the image capture device 600, through the center of the image capture device 600, and to a rear of the image capture device 600.

Figure 6B:
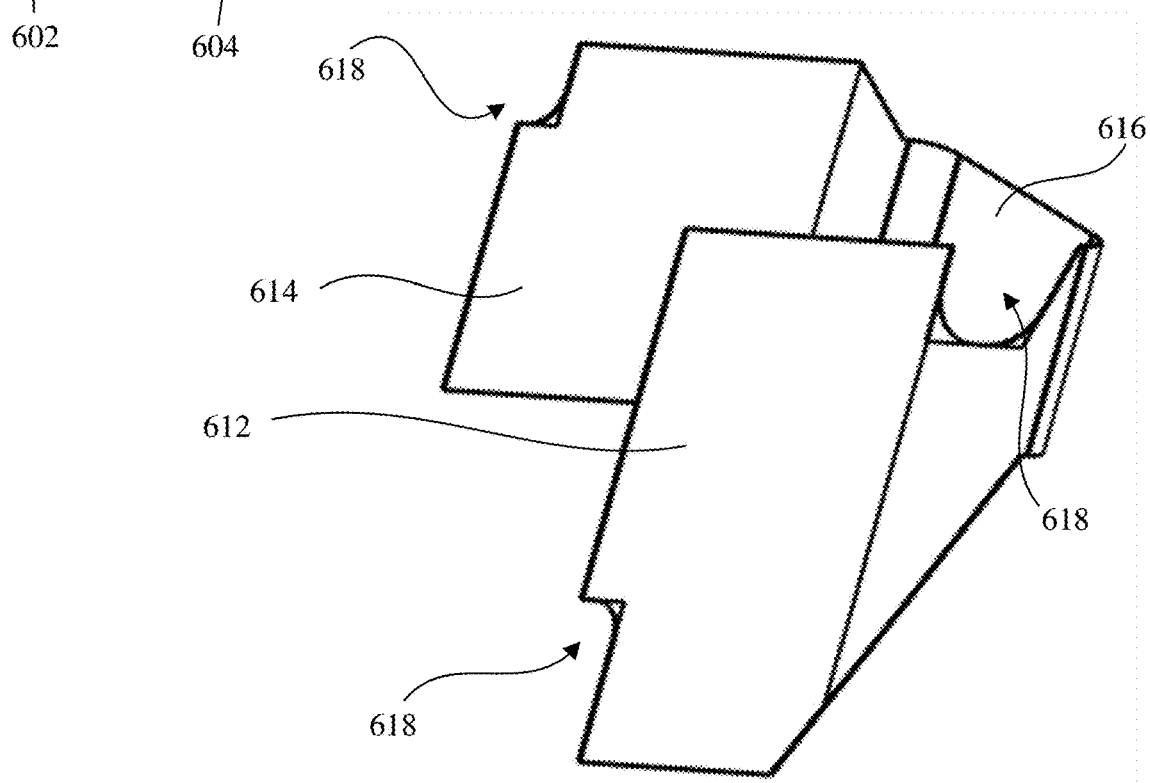
FIG. 6B is a rear isometric view of the heat transfer device of FIG. 6A.

FIG. 6B is an isometric side view of the front heat spreader 606. The front heat spreader 606 includes a front thermal contact surface 612, a rear thermal contact surface 614, and a transfer surface 616 in communication with and connecting the front thermal contact surface 612 and the rear thermal contact surface 614.

The rear thermal contact surface 614 is located on a rear side of the image capture device 600. The rear thermal contact surface 614 may be in direct contact with the SOC 604 of FIG. 6A. The rear thermal contact surface 614 may be connected to the SOC 604 by an adhesive, tape, a flexible material, a compressible material, a conductive material, a thermal interface material (TIM), or a combination thereof. The rear thermal contact surface 614 may be in direct contact with the chassis 504 (of FIG. 5B). The rear thermal contact surface 614 may be connected to the SOC 604 and the chassis 506 (of FIG. 5B) The rear thermal contact surface 614 may be main body portion of the front heat spreader 606. The rear thermal contact surface 614 may have a size and shape that mirror a size and shape of the SOC 604. The rear thermal contact surface 614 may be connected to a printed circuit that is in communication with the SOC 604. The rear thermal contact surface 614 may extend within a first plane and then connect to a transfer surface 616.

The transfer surface 616 may extend between a front and a rear of the image capture device 600. The transfer surface 616 may extend perpendicular to the front heatsink 610 and the rear heatsink 602 of FIG. 6A. The transfer surface 616 may extend around internal components of FIG. 6A so that thermal energy may be balanced or moved from the rear to the front or vice versa. The thermal transfer surface 616 may be one monolithic piece that connects the rear thermal contact surface 614 to the front thermal contact surface 612 to thermally connect a front of the image capture device to a rear of the image capture device 600 of FIG. 6A.

The front thermal contact surface 612 functions to transfer heat to a front of the image capture device 600. The front thermal contact surface 612 may assist in dissipating heat. The front thermal contact surface 612 may be in direct contact with the front heatsink 610 of FIG. 6A, the chassis 608 of FIG. 6A, or both. The direct contact as discussed herein may mean an adhesive, fastener, mechanical fastener, TIM, or a combination thereof retains a connection between the front heat spreader 606 and some other structure. The direct connection may be between the front thermal contact surface 612 and the chassis 608, the front heatsink 610, or both. The front thermal contact surface 612 may only transfer heat. That is the front thermal contact surface 612 may not contact any heat generating components. The front thermal contact surface 612 may only contact heatsinks, heat dissipating devices, or heat holding devices such as a chassis 608 or a front heatsink 610. The front thermal contact surface 612 may extend parallel to the rear thermal contact surface 614.

The front heat spreader 606 may have a shape that is generally "U" shaped, "C" shaped, or both. The front heat spreader 606 may include one or more cutouts 618. The one front thermal contact surface 612, the rear thermal contact surface 614, the transfer surface 616, or a combination thereof may include one or more cutouts 618. The cutouts 618 may be an absence of material. The cutouts 618 may be a region that is complementary to a component of the image capture device 600 of FIG. 6A. The cutouts 618 may be an absence of material where the front heat spreader 606 extends around components so that thermal energy may be guided to a location of interest such as a front heatsink 610, rear heatsink 602, or both. The cutouts 618 may be located in a top edge, a bottom edge, a first side edge, a second side edge, or a combination thereof. The cutouts 618 may be located in corners, edges, or both of the front heat spreader 606. The cutouts 618 may prevent the front heat spreader 606 from contacting any other components.

Figure 7A:
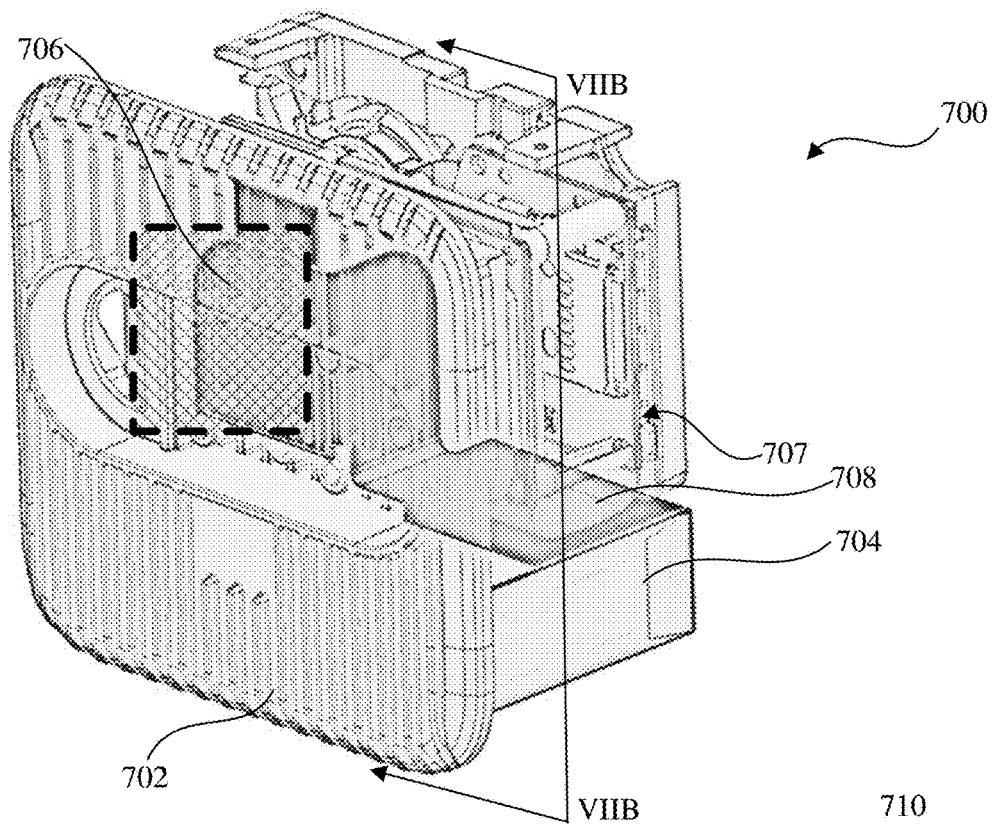
FIG. 7A is a rear isometric view of the image capture device of FIG. 3B with a rear heatsink and a housing in transparent so that a heat transfer device is visible that transfers heat from a heat generating component to a battery.

FIG. 7A is a rear isometric view of an image capture device 700. The image capture device 700 includes a rear heatsink 702 covering a rear of the image capture device 700. The image capture device 700 includes a battery 704 located on bottom of the image capture device 700. The image sensor 706 functions to capture images through a lens of the image capture device 700. The image sensor 706 may store images, process images, edit images, or a combination thereof. The image sensor 706 may capture still images, movies, or both. The image sensor 706 may be connected to one or more lens assemblies. The image sensor 706 may be a heat generating device. The image sensor 706 may be in thermal communication with a heat transfer device 707 such as a sensor heat spreader 708. The sensor heat spreader 708 may thermally connect the image sensor 706 to the battery 704. The sensor heat spreader 708 may transfer thermal energy into the battery 704. The sensor heat spreader 708 may thermally connect the image sensor 706 and the battery 704 so that the battery 704 stores, dissipates, collects, or a combination thereof thermal energy generated by the image sensor 706. The sensor heat spreader 708 may extend within or along one or more planes, two or more planes, three or more planes, or four or more planes. The sensor heat spreader 708 may include one or more bends, two or more bends, three or more bends, or four or more bends. The sensor heat spreader 708 may turn or curve around one or more internal components of the image capture device 700. The image sensor 706 may form a sensor contact region 710 where the sensor heat spreader 708 extends along one or both sides of the image sensor 706. The sensor contact region 710 may be in direct contact with the image sensor 706 so that the sensor heat spreader 708 removes thermal energy from the image sensor 706.

Figure 7B:
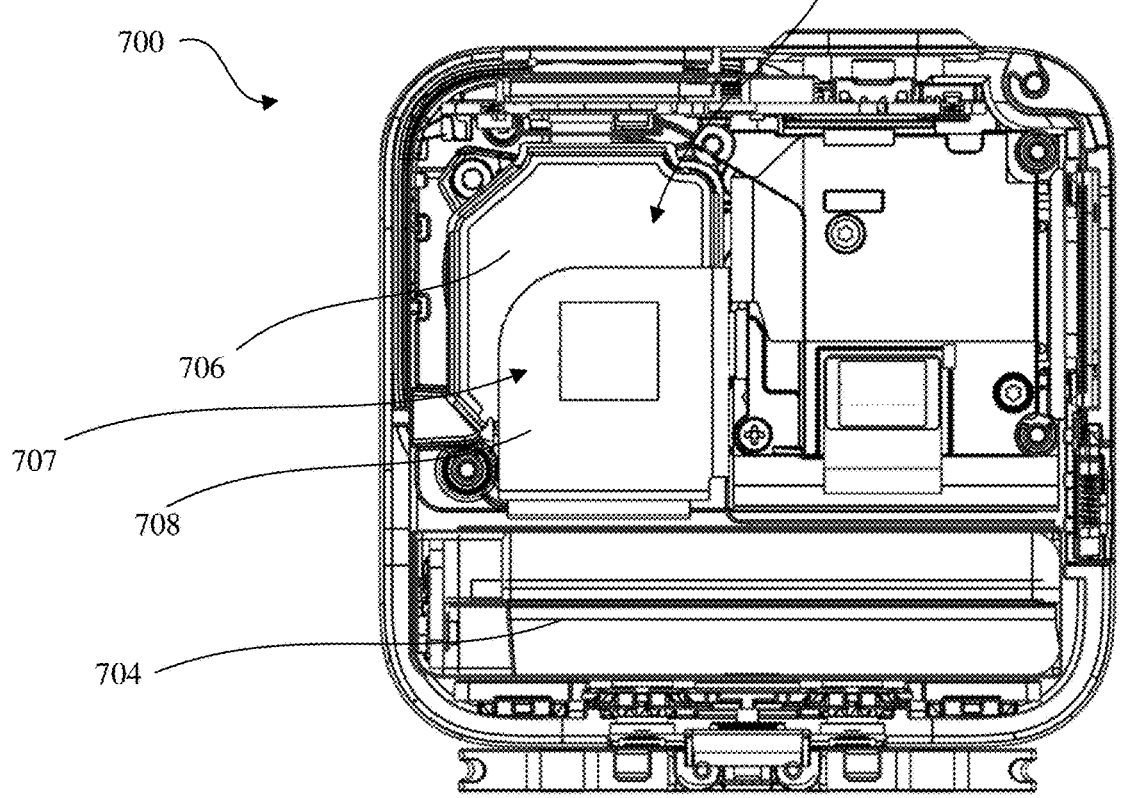
FIG. 7B is a rear plan view of the image capture device of FIG. 7A.

FIG. 7B illustrates a rear plan view of the image capture device 700 with the rear heatsink 702 of FIG. 7A removed. The battery 704 extends along a bottom of the image capture device 700. The image sensor 706 is located above the battery 704 and is in thermal communication with the battery 704 via the heat transfer device 707.

The heat transfer device 707 is made of a material that transfers heat. The heat transfer device 707 may be made of a material that has a higher thermal conductivity than the image sensor 706. The heat transfer device 707 may be made of or include graphite, graphene, silver, nickel, copper, tungsten, zinc, or a combination thereof. The heat transfer device 707 may have a thermal conductivity of about 100 W/m*K or more, about 150 W/m*K or more, about 200 W/m*K or more, about 250 W/m*K or more, about 300 W/m*K or more, about 350 W/m*K or more, about 400 W/m*K or more, or about 450 W/m*K or more. The heat transfer device 707 may have a thermal conductivity of about 500 W/m*K or more, about 750 W/m*K or more, about 1,000 W/m*K or more, about 1,250 W/m*K or more, about 1,500 W/m*K or more, about 1,750 W/m*K or more, about 2,000 W/m*K or more. The heat transfer device 707 may have a thermal conductivity of about 3,500 W/m*K to about 5,000 W/m*K. The heat transfer device 707 may be the sensor heat spreader 708.

The sensor heat spreader 708 may be in direct contact with the image sensor 706 to remove thermal energy from the image sensor 706 and transfer that thermal energy to the battery 704. The sensor heat spreader 708 may be a planar material, a flexible material, a film, or a combination thereof. The sensor heat spreader 708 may extend around one or more components of the image capture device 700. The sensor heat spreader 708 may extend between the image sensor 706 and the battery 704. The sensor heat spreader 708 includes a sensor contact region 710 that contacts the image sensor 706 to remove thermal energy. The sensor contact region 710 may be in direct contact, indirect contact, or both with the image sensor 706. The sensor contact region 710 may be in direct contact with a first side and indirect contact with a second side of the image sensor 706.

Figure 7C:
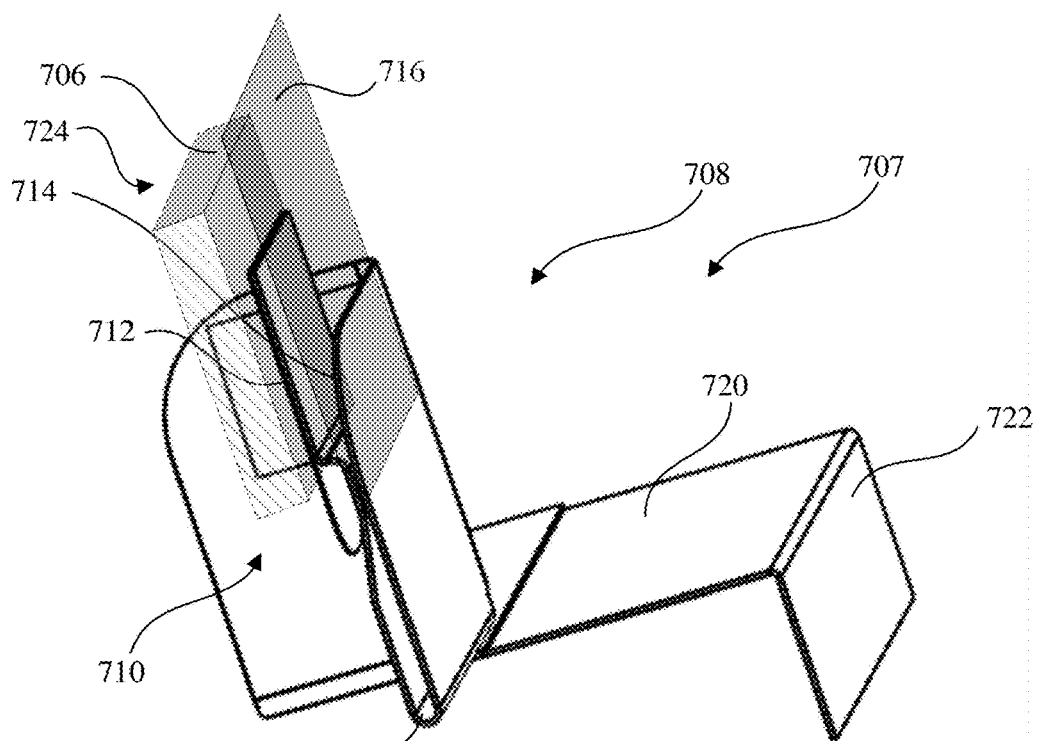
FIG. 7C is a side isometric view of the heat transfer device of FIG. 7A.

FIG. 7C is an isometric view of the heat transfer device 707 in contact with the image sensor 706. The heat transfer device 707 may be the sensor heat spreader 708 that transfers energy from a first location to a second location (e.g., an image sensor to a battery). The sensor heat spreader 708 includes a sensor contact region 710 that contacts the image sensor 706 and corresponding components.

The sensor contact region 710 may form a pocket, have one or more parallel walls, or both. The sensor contract region 710 may be "U" shaped. The sensor contact region 710 may contact the image sensor 706 at a first surface and contact other components at a second surface. The sensor contact region 710 may have two portions (e.g., two surfaces) that extend parallel to one another. The sensor contact region 710 may include a primary contact surface 712 and a secondary contact surface 714.

The primary contact surface 712 and the secondary contact surface 714 may form a first contact surface and a second contact surface. The primary contact surface 712 may be in direct contact or indirect contact with the image sensor 706. The secondary contact surface 714 may be in indirect contact with the image sensor 706 and direct contact with an electromagnetic interface shield (EMI shield) 716. The primary contact surface 712, the secondary contact surface 714, or both may be fixedly connected to the image sensor 706 or the EMI shield 716. The fixed connection may be glue, tape, pressure sensitive adhesive, thermal glue, solder, weld, TMI, or a combination thereof. The primary contact surface 712 and the secondary contact surface 714 may sandwich all or a portion of the image sensor 706, the EMI shield 716, or both to create a thermal communication. The primary contact surface 712 and the secondary contact shield 714 may sandwich only the EMI shield 716 therebetween.

The EMI shield 716 may prevent electromagnetic radiation from extending between components such as from a sensor, heat generating device, the battery 704 of FIGS. 7A-7B, an electrical component, or a combination thereof. The EMI shield 716 may be a piece of metal, a metallic shield, a material that inhibits electromagnetic interference, or both. The EMI shield 716 may be in direct or indirect contact with the image sensor 706. The EMI shield 716 may be free of direct contact with the image sensor 706. The EMI shield 716 may extend between an electrical component (e.g., sensor, battery an image sensor and lens assembly) and other electrical components. The EMI shield 716 may block electromagnetic radiation from passing between electrical components. The EMI shield 716 may reduce electromagnetic radiation (e.g., reduce by 30 percent or more or 50 percent or more) from passing from a first electrical component to a second electrical component (e.g., two sensors or a battery and an image sensor). The EMI shield 716 may be located around all or a portion of the image sensor 706, all or a portion of the battery 704 of FIGS. 7A-7B. The EMI shield 716 may extend along one side of the image sensor 706. The EMI shield 716 may extend between or along one or more folds 718 where the image sensor contacts the primary contact surface 712 and the EMI shield 716 contacts the secondary contact surface 714.

The one or more folds 718 may fold a portion of the sensor heat spreader 708 back upon itself so that a first portion of the sensor heat spreader 708 extends parallel to a second portion of the sensor heat spreader 708. The folds 718 may be two or more pieces of the sensor heat spreader 708 or three or more pieces of the sensor heat spreader 708 that are layered one above another or parallel to one another. The folds 718 may form the sensor contact region 710. The folds 718 may located in one or more regions of the sensor heat spreader 708. The folds 718 may be located proximate to or within the sensor contact region 710, a primary battery contact surface 720, a secondary battery contact surface 722, or a combination thereof.

The primary battery contact surface 720 may include one or more folds 718. The primary battery contact surface 720 may be in direct contact with the battery 704 of FIGS. 7A-7B. The primary battery contact surface 720 may contact another heat spreader (e.g., the battery heat spreader 364" of FIG. 3D). The primary battery contact surface 720 may transfer thermal energy into the battery so that the battery stores the thermal energy, dissipates the thermal energy, balances the thermal energy, or a combination thereof of the image capture device 700 of FIG. 7A. The primary battery contact surface 720 may extend along a top, a bottom, a left side, a right side, or a combination thereof of a battery. The primary battery contact surface 720 may contact a major surface of the battery (e.g., a surface with a greatest surface area of the battery). For example, if the top of the battery has a largest area then the primary battery contact surface 720 may contact the top of the battery. The primary battery contact surface 720 may be fixedly connected to the battery (e.g., 704 of FIGS. 7A-7B), a heat spreader (e.g., the battery heat spreader 364" of FIG. 3D), or a combination thereof. The fixed connection may be formed by any of the materials discussed herein such as an adhesive or a mechanical connection. The primary battery contact surface 720 may be directly connected to a secondary battery contact surface 722.

The secondary battery contact surface 722 may extend over one or more secondary surfaces of the battery (e.g., 704 of FIGS. 7A-7B). The secondary battery contact surface 722 may provide thermal energy into a second surface of the battery (e.g., 704 of FIGS. 7A-7B). The secondary battery contact surface 722 may be substantially a same size as the primary battery contact surface 720. The secondary battery contact surface 722 may be smaller than the primary battery contact surface 720. The primary battery contact surface 720 and the secondary battery contact surface 722 may have a size ratio of about 1:1, about 1.5:1 or more, about 2:1 or more, about 3:1 or more, or about 4:1 or more. The secondary battery contact surface 722 may wrap from a first surface to a second surface. The secondary battery contact surface 722 may be in direct contact with the battery (e.g., 704 of FIGS. 7A-7B), the heat spreader (e.g., the battery heat spreader 364" of FIG. 3D), or both. The secondary battery contact surface 722 may be fixedly connected as discussed herein with a material discussed herein. The primary battery contact surface 720, the secondary battery contact surface 722, or both may transfer thermal energy from a sensor 724 to the battery (e.g., 704 of FIGS. 7A-7B), the heat spreader (e.g., the battery heat spreader 364" of FIG. 3D), or both.

The sensor 724 may be any sensor that produces thermal energy. The sensor 724, shown in transparent, is located within the sensor contact region 710 and in contact with the primary contact surface 712. The sensor 724 may be an image sensor 706, a processor, memory, a micro-processor, or a combination thereof. The sensor 724 may be connected to a printed circuit board.

Figure 7D:
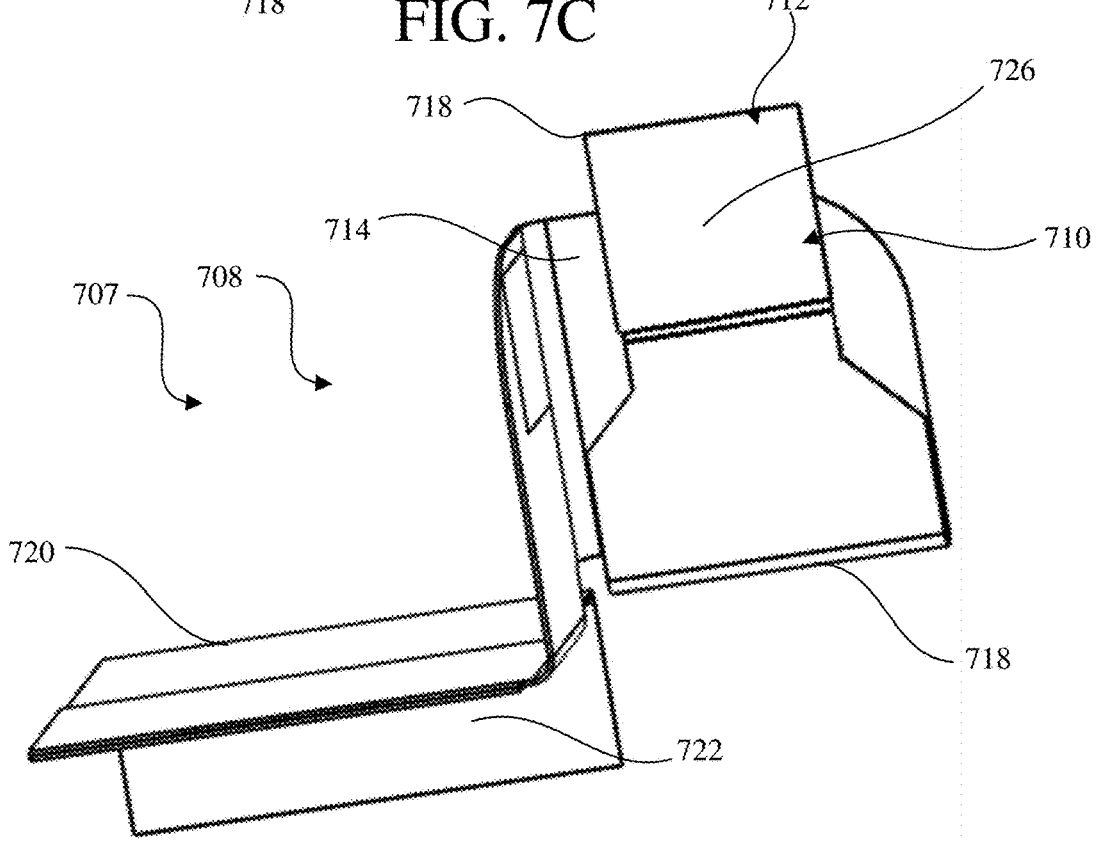
FIG. 7D is a rear isometric view of the heat transfer device of FIG. 7A.

FIG. 7D is a side isometric view of the heat transfer device 707. The heat transfer device 707 may be the sensor heat spreader 708 discussed herein. The heat transfer device 707 includes the sensor contact region 710 that contacts a heat generating device (e.g., a sensor 724 of FIG. 7C). The sensor contact region 710 includes the primary contact surface 712 and the secondary contact surface 714.

The sensor contact region 710 through the primary contact surface 712 and the secondary contact surface 714 removes thermal energy from heat generating devices such as the sensor 724 of FIG. 7C. As shown, the secondary contact surface 714 extends above the primary contact surface 712. The primary contact surface 712 may be in direct contact with the image sensor 706 of FIG. 7C and the secondary contact surface 714 may be in direct contact with the EMI shield 716 (e.g., the secondary contact surface 714 may indirectly remove heat from the sensor 724 through the EMI shield 716). The primary contact surface 712 may include one or more fastening materials 726.

The fastening materials 726 may be any material that provides a thermal connection between the sensor heat spreader 708 and a heat generating device (e.g., image sensor). The fastening material 726 connects the sensor 724 of FIG. 7C to the primary contact surface 712. The fastening material 726 may be located on any surface of the sensor heat spreader 708 where a thermal connection is needed. The fastening material 726 may be glue, adhesive, pressure sensitive adhesive, weld, solder, a thermal adhesive, or a combination thereof that connects the sensor heat spreader 708 to a heat generating device such as the primary contact surface 712 to the image sensor 706 or the secondary contact surface 714 to the EMI shield 716. The primary contact surface 712 and the secondary contact surface 714 may be formed by the one or more folds 718 in the sensor heat spreader 708.

The folds 718 may be located at a top of the secondary contact surface 714, a bottom of the secondary contact surface 714, or both. The secondary contact surface 714 may extend from the primary contact surface 712 and turn from a fold 718 (e.g., a first fold) and extend parallel to the primary contact surface 712 then turn downward at another fold 718 (e.g., a second fold). The primary contact surface 712 and the secondary contact surface 714 may transfer thermal energy to the primary battery contact surface 720 and the secondary battery contact surface 722.

The secondary battery contact surface 722 extends from the primary battery contact surface 720 in a generally perpendicular direction. The primary battery contact surface 720 and the secondary battery contact surface 722 may transfer thermal energy to the battery (e.g., 704 of FIGS. 7A-7B) to balance thermal energy within the image capture device 700 of FIG. 7A.

Figure 8A:
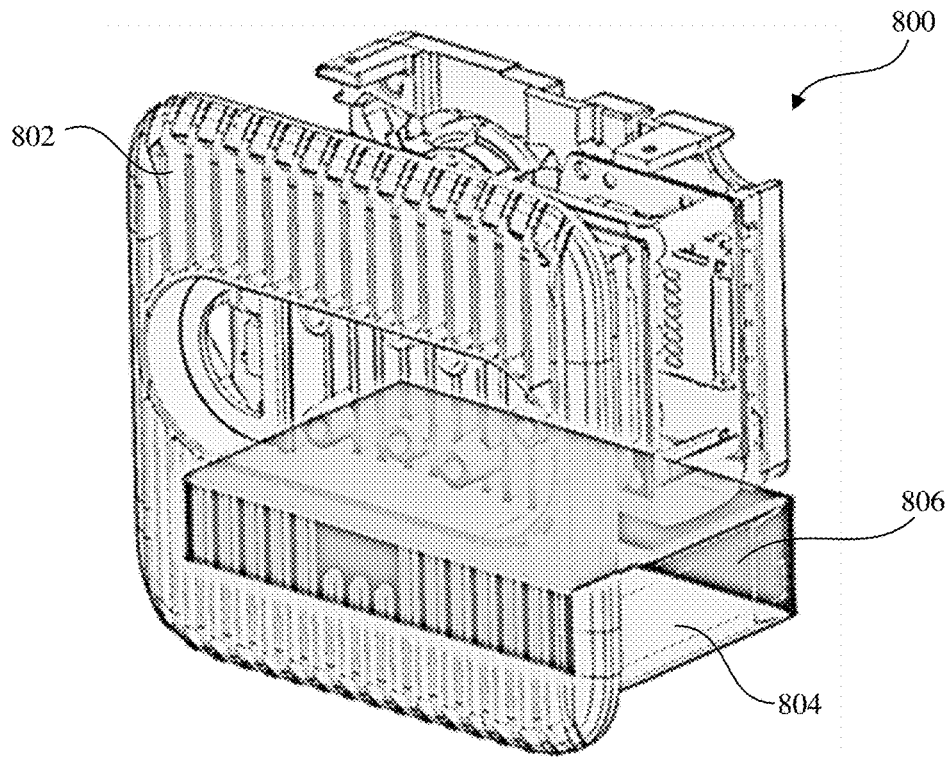
FIG. 8A is a rear isometric view of the image capture device of FIG. 3B with a rear heatsink and a housing in transparent so that a heat transfer device is visible that transfers heat into a battery.

FIG. 8A is a rear isometric view of an image capture device 800. The image capture device 800 includes a rear heatsink 802, which is shown in transparent so that a battery 804 and a battery heat spreader 806. The battery heat spreader 806 wraps the battery 804 so that thermal energy may be transferred into the battery 804. The battery 804 may act as a heatsink for one or more of the heat generating devices discussed herein. The battery 804 may work in conjunction with the rear heatsink 802 to balance the thermal load within the image capture device 800.

Figure 8B:
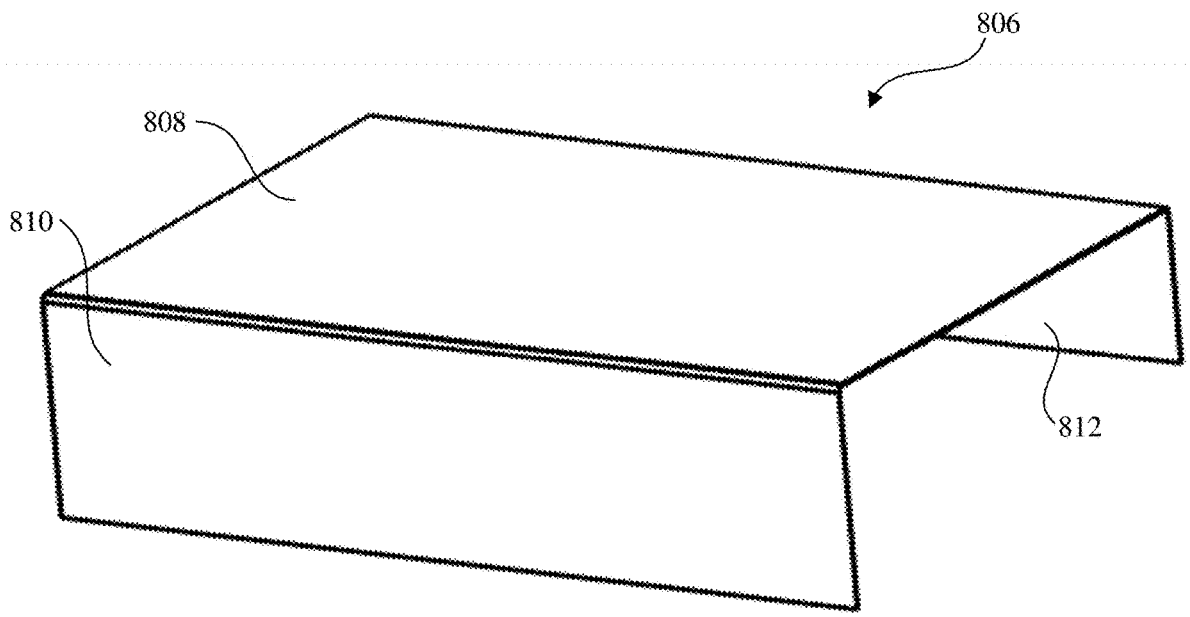
FIG. 8B is a top isometric view of the heat transfer device of FIG. 8A.

FIG. 8B is a side isometric view of the battery heat spreader 806 of FIG. 8A. The battery heat spreader 806 includes a primary battery surface 808 with a first side battery surface 810 extending along a first side and a second side battery surface 812 extending along a second side of the primary battery surface 808. The primary battery surface 808 may contact a major surface of the battery 804 of FIG. 8A. The major surface may be a surface of the battery 804 with a greatest surface area when compared to the other surfaces (e.g., first side, second side, first end, second end).

The primary battery surface 808 of the battery heat spreader 806 may transfer thermal energy. The primary battery surface 808 may be in direct contact with the primary battery contact surface 720 of the sensor heat spreader 708 of FIGS. 7A-7D. The primary battery surface 808 of the battery heat spreader 806 may receive thermal energy from the sensor heat spreader 708. The primary battery surface 808 may extend over a top of the battery 804 of FIG. 8A while first side battery surface 810 connects to the primary battery surface 808 and extends along a first surface of the battery 804 of FIG. 8A. A second side battery surface 812 may extend from the primary battery surface 808 along a second side of the battery 804 of FIG. 8A. The first side battery surface 810 or the second side battery surface 812 may be in contact with the secondary battery contact surface 722 of the sensor heat spreader 708 FIGS. 7A-7D.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An image capture device comprising: heat generating devices that generate a thermal load; one or more batteries; a chassis that is located within the image capture device, the chassis being in thermal communication with a second of the heat generating devices; a sensor heat spreader in thermal communication with one or more of the heat generating devices and extending from the one or more of the heat generating devices in contact with an entire side surface of the one or more batteries so that all or a portion of the thermal load is transferred to the one or more batteries via the entire side surface via the entire side surface; wherein a rear heatsink forms an entire rear wall of the image capture device.

2. The image capture device of claim 1, further comprising:
a battery heat spreader that is in thermal communication with the one or more batteries.

3. The image capture device of claim 2, wherein the battery heat spreader is in direct contact with the one or more batteries and the sensor heat spreader is connected to the battery heat spreader so that all or a portion of the thermal load from the heat generating devices is transferred from the sensor heat spreader into the one or more batteries through the battery heat spreader.

4. The image capture device of claim 1, wherein the one or more of the heat generating devices in communication with the sensor heat spreader is an image sensor.

5. The image capture device of claim 1, wherein the second of the heat generating devices is a system on chip of the image capture device.

6. The image capture device of claim 1, further comprising:
a rear heatsink that forms a rear wall of the image capture device and is in contact with ambient conditions surrounding the image capture device.

7. An image capture device comprising: heat generating devices that generate a thermal load; one or more batteries; one or more batteries; a sensor heat spreader in thermal communication with one or more of the heat generating devices and in contact with an entire side surface of the one or more batteries to transfer the thermal load along the entire side surface of the one or more batteries; a rear heatsink in thermal contact with a first of the heat generating devices and in thermal contact with ambient conditions surrounding the image capture device so that some or all of the thermal load is transferred from a first sensor through the rear heatsink and into the ambient conditions surrounding the image capture device, wherein the rear heatsink forms an entire rear wall of the image capture device.

8. The image capture device of claim 7, further comprising: a front heatsink in thermal communication with the second of the heat generating devices.

9. The image capture device of claim 7, further comprising: a front heat spreader connected to the first of the heat generating devices at a first end and connected to the chassis at a second end.

10. The image capture device of claim 9, wherein the front heat spreader connects to the first of the heat generating devices proximate to the rear heatsink, extends around a side of the image capture device, and connects to the chassis proximate a front of the image capture device.

11. The image capture device of claim 9, wherein the front heat spreader forms a "U" shape within the image capture device.

12. The image capture device of claim 7, wherein the rear heatsink is in direct contact with the first of the heat generating devices.

13. An image capture device comprising: a battery; a front heatsink having a front mass; a rear heatsink located on an opposite side of the image capture device as the front heatsink, the rear heatsink having a rear mass; heat generating devices located between the front heatsink and the rear heatsink, wherein the heat generating devices generate a thermal load and the thermal load is transferred to the front heatsink, the rear heatsink, a sensor heat spreader that thermally connects one or more of the heat generating devices to the battery so that the battery receives some or all of the thermal load from the one or more of the heat generating devices; and a chassis located between the front heatsink and the rear heatsink, wherein the chassis is directly connected to the front heatsink, wherein the rear mass is double or more the front mass so that the rear heatsink can receive double the thermal load or more than received by the front heatsink from the heat generating devices.

14. The image capture device of claim 13, wherein the rear mass is triple the front mass.

15. The image capture device of claim 14, wherein the rear heatsink is in direct communication with one or more of the heat generating devices and a front heat spreader thermally connects the one or more of the heat generating devices with the chassis.

* * * * *